(12) United States Patent
Ohnishi

(10) Patent No.: US 6,423,458 B2
(45) Date of Patent: Jul. 23, 2002

(54) MONITORING METHOD OF DEVELOPING SOLUTION FOR LITHOGRAPHIC PRINTING PLATES

(75) Inventor: Hironori Ohnishi, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 09/775,823

(22) Filed: Feb. 5, 2001

(30) Foreign Application Priority Data

Feb. 8, 2000 (JP) .......................................... 2000-030642
Feb. 29, 2000 (JP) .......................................... 2000-054090

(51) Int. Cl.$^7$ ................................................. G03F 7/30
(52) U.S. Cl. .......................................................... 430/30
(58) Field of Search ............................................ 430/30

(56) References Cited

U.S. PATENT DOCUMENTS 6,120,945 A * 9/2000 Tanaka ........................ 430/30

* cited by examiner

*Primary Examiner*—Hoa Van Le
(74) *Attorney, Agent, or Firm*—Burns, Doane, Swecker & Mathis, LLP

(57) ABSTRACT

A monitoring method of a developing solution for lithographic printing plates, which comprises, when a large number of lithographic printing plates are processed by use of an automatic developing processor, adding a tracing substance stable under alkaline conditions to light-sensitive layers of the lithographic printing plates, or one or both of the developing solution which has been provided at the beginning of development and a development replenisher, and then measuring the amount of said tracing substance in the developing solution during development, thereby judging processing ability of the developing solution.

7 Claims, No Drawings

MONITORING METHOD OF DEVELOPING SOLUTION FOR LITHOGRAPHIC PRINTING PLATES

FIELD OF THE INVENTION

The present invention relates to a monitoring method of a developing solution used in processing a large number of lithographic printing plates by use of an automatic developing processor.

BACKGROUND OF THE INVENTION

It has hitherto been known that developing solutions deteriorated by development of a large number of lithographic printing plates are allowed to recover by replenishment of replenishers. For example, JP-A-1-21451 (the term "JP-A" as used herein means an "unexamined published Japanese patent application") discloses that a process of measuring the electric conductance, comparing the measured value with the electric conductance showing the optimum development activity, which has previously been determined by an experiment, and replenishing a development replenisher when the measured value is lower, thereby keeping the development activity of the developing solution proper. Further, JP-A-4-172355 discloses a process of measuring the amount of a dissolved light-sensitive layer by measurement of the total organic carbon concentration in a developing solution, and replenishing a replenisher according to the measured amount.

Still further, JP-A-58-95349 discloses a process of providing a sensor for electrically measuring the degree of elution of a light-sensitive layer of a non-image area of a light-sensitive plate, and replenishing a development replenisher when the degree of elution is decreased to a specified level.

JP-A-61-61164 discloses a process of measuring the electric conductance, and replenishing a development replenisher when a set level of the electric conductance rises with the processing amount to reach a set value or less.

However, the process of JP-A-1-21451 has the problem that the development activity can not be kept normal under some circumstances, from the fact that the electric conductance of the developing solution also changes with spontaneous evaporation of water in the developing solution. Further, the process of JP-A-4-172355 has the problem that some kinds of organic carbons existing in the developing solution can not be accurately measured in the amount of the dissolved light-sensitive layer, and can not be applied to, for example, a developing solution mainly containing an organic substance as described in JP-A-9-274324. In addition, a process has already been known in which a reduction in processing ability of a developing solution is estimated from the integrated processing area of lithographic printing plates and the integrated operation time of a processor, and a development replenisher is replenished according thereto. In this case, however, it is impossible to recognize the amount and the kind of dissolved light-sensitive layer directly contributing to a reduction in activity of the developing solution, resulting in unstable development activity. For example, no consideration is given to the difference between the case where one side is printed and the case where both sides are printed, changes in the kind of printing plate, and changes in area ratio of an image area to a non-image area.

Further, conventional processes each have the problem that a set value for directing replenishment is not accurately obtained because of changes in ingredient concentration (changes in the concentration rate) of a developing solution which can occur by evaporation of water or back flow of water from a water washing unit, resulting in failure to conduct replenishment. Furthermore, it is necessary to change a control value as the developing solution in a developing tank is substituted by a replenisher, and the substitution rate is detected by the operation time of a pump and integration of the discharge amount. Accordingly, there is the problem that the detecting accuracy is inferior, which causes failure to accurately obtain the set value for directing replenishment.

SUMMARY OF THE INVENTION

An object of the present invention is to keep the development activity of a developing solution good and stable, upon processing a large number of (photosensitive) lithographic printing plates using the automatic developing processor, and to overcome the disadvantages of the conventional processes as described above.

A further object of the present invention is to improve the disadvantages of the conventional processes as described above, and more particularly, to provide a method for monitoring a developing solution so that a set value for directing replenishment can be accurately obtained by accurately detecting the substitution rate of a replenisher for a developing solution, and further by accurately detecting the concentration rate of the developing solution.

The objects of the present invention are attained by the following monitoring method of a developing solution for lithographic printing plates:

(1) A monitoring method of a developing solution for lithographic printing plates, which comprises, when a large number of lithographic printing plates are processed by use of an automatic developing processor, adding a tracing substance stable under alkaline conditions to light-sensitive layers of the lithographic printing plates, or one or both of the developing solution which has been provided at the beginning of development and a development replenisher, and then measuring the amount of the tracing substance in the developing solution during development, thereby judging processing ability of the developing solution;

(2) The monitoring method described in the above (1), wherein when a large number of lithographic printing plates are processed by use of the automatic developing processor, the tracing substance stable under alkaline conditions is added to the light-sensitive layers of the lithographic printing plates, and the amount of the tracing substance dissolved in the developing solution is measured, thereby judging processing ability of the developing solution;

(3) The monitoring method described in the above (1), wherein when the lithographic printing plates are processed by use of the automatic developing processor while replenishing the developing solution which has been provided at the beginning of development with the development replenisher, the tracing substance stable under alkaline conditions and not contributing to development is added to one or both of the developing solution which has been provided at the beginning of development and the development replenisher, in different concentrations when added to both, and then the amount of the tracing substance in the solution during development is measured, thereby determining the substitution rate of the development replenisher for the developing solution which has been provided at the beginning of development;

(4) The monitoring method described in the above (1), wherein when the lithographic printing plates are processed by use of the automatic developing processor while replenishing the developing solution which has been provided at the beginning of development with the development replenisher, the tracing substance stable under alkaline conditions and not contributing to development is added to one or both of the developing solution which has been provided at the beginning of development and the development replenisher, in different concentrations when added to both, the amount of the tracing substance in the solution during development is measured, thereby determining the substitution rate of the development replenisher for the developing solution which has been provided at the beginning of development, and the substitution rate is further compared with the substitution rate determined from the integrated discharge amount of a pump of the automatic developing processor, thereby determining the concentration rate of the developing solution;

(5) The monitoring method described in the above (1), wherein when the lithographic printing plates are processed by use of the automatic developing processor while replenishing the developing solution which has been provided at the beginning of development with the development replenisher, the different tracing substances stable under alkaline conditions and not contributing to development are each added to the developing solution which has been provided at the beginning of development and the development replenisher, respectively, the amounts of the tracing substances in the solution during development are measured, thereby determining the substitution rate of the development replenisher for the developing solution which has been provided at the beginning of development and the concentration rate of the developing solution;

(6) The monitoring method described in the above (1), wherein when the lithographic printing plates are processed by use of the automatic developing processor while replenishing the developing solution which has been provided at the beginning of development with the development replenisher, the tracing substance stable under alkaline conditions and not contributing to development is added to either of the developing solution which has been provided at the beginning of development or the development replenisher, the amount of the tracing substance in the solution during development and the concentration of a main ingredient of the developing solution are measured, thereby determining the substitution rate of the development replenisher for the developing solution which has been provided at the beginning of development and the concentration rate of the developing solution; and (7) The monitoring method described in the above (1), wherein when the lithographic printing plates are processed by use of the automatic developing processor while replenishing the developing solution which has been provided at the beginning of development with the development replenisher, a main development ingredient of the developing solution which has been provided at the beginning of development is different from a main development ingredient of the development replenisher, and the concentrations of both the main development ingredients are measured, thereby determining the substitution rate of the development replenisher for the developing solution which has been provided at the beginning of development and the concentration rate of the developing solution.

DETAILED DESCRIPTION OF THE INVENTION

According to the monitoring method of the present invention, the substance stable against an alkali agent of the developing solution and the development replenisher and not contributing to development (hereinafter referred to as the tracing substance in this specification) is added to the light-sensitive layer of the lithographic printing plate to be developed. As a result, the amount of the tracing substance dissolved in the developing solution by development of the lithographic printing plate is detected, and the degree of deterioration in the development activity of the developing solution can be directly judged by the amount. The tracing substance is inactive and stable against all kinds of developing solutions, so that it is stably detectable regardless of the kind of developing solution. Accordingly, the method of the present invention can make a more accurate judgment than the conventional methods. According to previously programmed indication, the optimum replenishment rate of the replenisher is calculated from the above-mentioned amount, for example, by utilizing a computer, and the optimum replenishment rate is automatically replenished, thereby being able to keep the activity of the developing solution constant. The amount of the tracing substance added is preferably from 0.001% to 10% by weight, and most preferably from 0.01% to 1% by weight. When a phosphorus- or sulfur-containing substance is used as the tracing substance, it can be contained as a substance constituting the light-sensitive layer described later. In that case, it can be added in an amount of 0.001% to 100% by weight.

According to the monitoring method of the above-mentioned embodiment (3), the tracing substance is added to at least one of the developing solution which has been provided at the beginning of development and the development replenisher. When the tracing substance is added to both solutions, the concentration thereof in the developing solution which has been provided at the beginning of development is made different from that in the development replenisher. In development, the concentration of the tracing substance in the developing solution is detected, the substitution rate of the development replenisher for the developing solution which has been provided at the beginning of development is calculated from this detected value, and the rate of changes in ingredient concentration of the developing solution is further calculated from this rate of substitution. The initial concentration of the tracing substance added is preferably from 0.1 mg/L to 10,000 mg/L, and more preferably from 1 mg/L to 500 mg/L. Then, the optimum value of the replenishment rate is calculated from the rate of changes in ingredient concentration of the developing solution according to previously programmed indication, and the replenisher is automatically replenished, thereby being able to maintain the activity of the developing solution in a good state.

According to the monitoring method of the above-mentioned embodiment (4), the tracing substance is added to at least one of the developing solution which has been provided at the beginning of development and the development replenisher. When the tracing substance is added to both solutions, the concentration thereof in the developing solution which has been provided at the beginning of development is made different from that in the development replenisher. In development, the concentration of the tracing substance in the developing solution is detected, and the substitution rate of the development replenisher for the developing solution which has been provided at the beginning of development is calculated from this detected value. The substitution rate thus calculated is further compared with the substitution rate determined from the integrated discharge amount of a pump of the automatic developing processor, thereby determining the concentration rate of the developing solution. The rate of changes in ingredient concentration of the developing solution is further calculated from the substitution rate and the concentration rate. The initial concentration of the tracing substance added is preferably from 0.1 mg/L to 10,000 mg/L, and more preferably from 1 mg/L to 500 mg/L. Then, the optimum value of the replenishment rate is calculated from the ingredient concentration of the developing solution according to previously programmed indication, and the replenisher is automatically replenished, thereby being able to maintain the activity of the developing solution in a good state.

According to the monitoring method of the above-mentioned embodiment (5), the different tracing substances are each added to the developing solution which has been provided at the beginning of development and the development replenisher, respectively. In development, these tracing substances are each detected, the substitution rate of the development replenisher for the developing solution which has been provided at the beginning of development and the concentration rate of the developing solution are calculated from these detected values, and the rate of changes in ingredient concentration of the developing solution is further calculated from the substitution rate and the concentration rate. The initial concentration of the tracing substance added is preferably from 0.1 mg/L to 10,000 mg/L, and more preferably from 1 mg/L to 500 mg/L. Then, the optimum value of the replenishment rate is calculated from the rate of changes in ingredient concentration of the developing solution according to previously programmed indication, and the replenisher is automatically replenished, thereby being able to maintain the activity of the developing solution in a good state.

According to the monitoring method of the above-mentioned embodiment (6), the tracing substance is added to the developing solution which has been provided at the beginning of development and the development replenisher. In development, the concentration of the tracing substance in the developing solution and the concentration of the main development ingredient are detected, the substitution rate of the development replenisher for the developing solution which has been provided at the beginning of development and the concentration rate of the developing solution are calculated from these detected values, and the rate of changes in ingredient concentration of the developing solution is further calculated from the substitution rate and the concentration rate. The initial concentration of the tracing substance added is preferably from 0.1 mg/L to 10,000 mg/L, and more preferably from 1 mg/L to 500 mg/L. Then, the optimum value of the replenishment rate is calculated from the ingredient concentration of the developing solution according to previously programmed indication, and the replenisher is automatically replenished, thereby being able to maintain the activity of the developing solution in a good state.

According to the monitoring method of the above-mentioned embodiment (7), the main development ingredient added to the developing solution which has been provided at the beginning of development is made different from that added to the development replenisher. In development, the concentrations of the respective main development ingredients in the developing solution are detected, the substitution rate of the development replenisher for the developing solution which has been provided at the beginning of development and the concentration rate of the developing solution are calculated from these detected values, and the rate of changes in ingredient concentration of the developing solution is further calculated from the substitution rate and the concentration rate. Then, the optimum value of the replenishment rate is calculated from the ingredient concentration of the developing solution according to previously programmed indication, and the replenisher is automatically replenished, thereby being able to maintain the activity of the developing solution in a good state.

Constituent features of the lithographic printing plate of the present invention will be described below.

[Light-Sensitive Compositions]

The light-sensitive compositions applied as light-sensitive layers of the lithographic printing plates to which the present invention is applied will be described below. Thelithographic printing plates developed with the developing solutions and development replenishers to which the present invention is applied are preferably presensitized plates. The presensitized plates include a positive working presensitized plate using an o-quinonediazide light-sensitive layer, a reversal negative working presensitized plate using an o-quinonediazide light-sensitive layer, a negative working presensitized plate using a alkali-soluble diazonium salt in a light-sensitive layer, a negative working presensitized plate using a light-sensitive layer in which a resin containing dimethylmaleimido groups on its side chains is used as a photocrosslinking agent, a photopolymerizable presensitized plate using a photopolymerizable light-sensitive layer having a photopolymerization initiation system and a polymer having crosslinkable groups on its side chains and an overcoat layer (protective layer), a positive working infrared-sensitive presensitized plate comprising a light-sensitive layer containing a binders such as a cresol resin, a substance absorbing light to generate heat and a substance which is heat decomposable and reduces the solubility of the above-mentioned binder in its undecomposed state, and a negative working infrared-sensitive presensitized plate comprising a light-sensitive layer containing a compound which is decomposed by light or heat to generate an acid, a crosslinking agent which is crosslinked by the acid, at least one alkali-soluble resin and an infrared absorbing agent.

Of these, the light-sensitive composition of the positive working presensitized plate is mainly composed of a polymer binder and an o-quinonediazide compound.

The tracing substances contained in the light-sensitive layers will be described below.

[Tracing Substances]

As described above, the lithographic printing plates to which the present invention is applied are characterized in that trace elements and their compounds are contained in the light-sensitive layers as the tracing substances. As such elements constituting the tracing substances, any elements can be used in the present invention, as long as they are not contained in main ingredients of the developing solutions. For example, in the developing solution containing potassium silicate as a main ingredient, the elements include lithium, beryllium, boron, sodium, magnesium, aluminum, phosphorus, sulfur, calcium, scandium, titanium, vanadium, chromium, manganese, iron, cobalt, nickel, copper, zinc, gallium, germanium, arsenic, selenium, rubidium, strontium, yttrium, zirconium, niobium, molybdenum, ruthenium, rhodium, palladium, silver, cadmium, indium, tin, antimony, tellurium, cesium, barium, lanthanum, cerium, praseodymium, neodymium, europium, gadolinium, terbium, dysprosium, holmium, erbium, thulium, ytterbium, lutetium, hafnium, tantalum, tungsten, rhenium, osmium, iridium, platinum, gold, mercury, thallium, lead and bismuth. When the main ingredient is sodium silicate, potassium is preferably used, and when the main ingredient is sugar/alkali, silicon is preferably used. Of these, elements suffering little contamination from dilution water, washing water and air and causing no problem with regard to environmental contamination are preferred, and lithium, boron, phosphorus, sulfur, titanium, strontium, yttrium, zirconium, niobium, molybdenum, tungsten and bismuth are preferred because of their inexpensiveness and good general-purpose properties. Further, sodium, magnesium, potassium, calcium and silicon which are anticipated to suffer contamination from dilution water, washing water and air can also be used by selecting the concentration thereof added.

There is no particular limitation on the form of the compound added, as long as it does not affect on the performance of the developing solution, and any compound can be preferably used, as long as it is soluble in an organic solvent that is a coating solvent and stable under alkaline conditions. Examples thereof include inorganic salts such as oxides, hydroxides, halides, sulfates, nitrates, phosphates and carbonates. Chlorides are particularly preferred in terms of solubility in organic media. Organic acid salts such as formats, acetates, propionates, maleates, lactates, levulinates, malonates, adipates and fumarates can also be suitably used. For enhancing the solubility of the above-mentioned compounds, complex forming agents forming chelate compounds with elements in the solutions can also be added. The complex forming agents include, for example, hydroxyl group- or carboxyl group-containing nitrogen compounds and phenols.

Commercially available metal complex azo dyes and well-known dyes described, for example, in Senryo Binran (edited by Yuki Kagaku Kyokai, 1970), commercially available metal powder pigments, inorganic pigments and pigments described in *Color Index (C. I) Binran, Saishin Ganryo Binran* (edited by Nippon Ganryo Gijutsu Kyokai, 1977), *Insatsu Ink Gijutsu* (CMC Shuppan, 1984) and *Saishin Ganryo Oyo Gijutsu* (CMC Shuppan, 1986) may also be added. The above-mentioned pigments may also be surface treated. Representative surface treatment methods include methods of surface treating the pigments with resins or wax, methods of adhering surfactants to the pigments, and methods of combining reactive substances with surfaces of the pigments. The above-mentioned surface treatment methods are described in *Kinzoku Sekken no Seishitsu to Oyo* (Saiwai Shobo), *Insatsu Ink Gijutsu* (CMC Shuppan) and *Saishin Ganryo Oyo Gijutsu* (CMC Shuppan).

Further, commercially available metal-containing surfactants and surfactants described in *Surfactant Handbook* (Kogyo Tosho) can also be added.

They can also be added in the complex form. Examples of complex-forming ligands include monodentate ligands such as $NH_3$, $OH_2$, $NO^-$, $NO_2^-$, $NO_3^-$, $CN^-$, $SCN^-$, $Br—$, $Cl^-$, $F^-$, $I^-$, $CO_2$ and $CO$; and multidentate ligands such as ethylenediamine, $C_2O_4^{2-}$, $HOCN(CH_3)=C(CH_3)NO$, $OC(NH_2)_2$, $NH_2CH_2COO^-$, ethylenediaminetetraacetic acid, diethylenetriamine, triethylenetetramine, bipyridine, 1,10-phenanthroline, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid, 1,3-diaminocyclohexanetetraacetic acid, 1,3-diamino-2-propanoltetraaceticacid and organic phosphonic acids such as 2-phosphonobutane-1,2,4-tricarboxylic acid, aminotri (methylenephosphonic acid), 1-hydroxyethylidene-1,1-diphosphonic acid, 3,3-diphosphonopimelic acid, $(PO_3H_2)NCH_2CH_2N—(CH_2PO_3H_2)_2$ and $N(CH_2PO_3H_2)_3$. When the phosphorus- or sulfur-containing substance is used as the tracing substance, it can also be contained as a light-sensitive layer composition such as a binder, a development inhibitor or a printing out agent described later. Further, hydrolytic polymerizable organic metal compounds as described in JP-A-8-262700 can also be added. These tracing agents are added preferably in an amount of 0.001% to 10% by weight, and more preferably in an amount of 0.01% to 1% by weight. Less than 0.001% by weight causes too large an error in measurement to obtain a precise ingredient amount, whereas exceeding 10% by weight affects the printing plate performance and introduces the problem of increased cost. However, when the phosphorus- or sulfur-containing substance is used as the tracing substance, it can also be contained as a light-sensitive layer-constituting substance described later. In this case, it can be added in an amount of 0.001% to 100% by weight.

Then, other common ingredients will be described which are contained in the light-sensitive layers when the tracing substances are added to the light-sensitive layers, or the developing solutions and/or development replenishers.

[Binders]

Polymer compounds soluble in alkaline developing solutions are suitable as the binders. Particularly preferred examples of the aqueous alkali-soluble polymer compounds include phenol-formaldehyde resins, o-, m- and p-cresol-formaldehyde resins, m/p-mixed cresol-formaldehyde resins and phenol/ cresol (which may be any of o-, m-, p-, m/p-mixed and o/m-mixed) mixed formaldehyde resins. Further, pyrogallol, acetone resins, hydroxystyrene resins and halogenated hydroxystyrene resins are also preferred.

The amount of the polymer binder contained in the light-sensitive layer of the presensitized plate to which the present invention is applied is from 30% to 90% by weight, and more preferably from 40% to 70% by weight.

In the light-sensitive composition of the presensitized plate to which the present invention is applied, another alkali-soluble resin can be used simultaneously according to circumstances. Such an alkali-soluble resin is preferably a film-forming resin having as a polymerization ingredient at least one selected from the following alkali-soluble group-containing monomers of (1) to (4). Further, film-forming resins are suitably used in which monomers of (5) to (14) described below are copolymerized, as well as these alkali-soluble group-containing monomers.

(1) Acrylamides, methacrylamides, acrylates, methacrylates and hydroxystyrenes having aromatic hydroxyl groups, such as N-(4-hydroxyphenyl)acrylamide or N-(4-hydroxyphenyl)methacrylamide, o-, m- or p-hydroxystyrene, o- or m-bromo-p-hydroxystyrene, o- or m-chloro-p-hydroxystyrene and o-, m- or p-hydroxyphenyl acrylate or methacrylate;

(2) Unsaturated carboxylic acids such as acrylic acid, methacrylic acid, maleic acid, maleic anhydride and a half ester thereof, itaconic acid, itaconic anhydride and a half ester thereof;

(3) Unsaturated sulfonamides such as acrylamides such as N-(o-aminosulfonylphenyl)acrylamide, N-(m-aminosulfonylphenyl)acrylamide, N-(p-aminosulfonylphenyl)acrylamide, N-[1-(3-aminosulfonyl) naphthyl]acrylamide and N-(2-aminosulfonylethyl) acrylamide; methacrylamides such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide and N-(2-aminosulfonylethyl)methacrylamide; acrylates such as o-aminosulfonylphenyl acrylate, m-aminosulfonylphenyl acrylate, p-aminosulfonylphenyl acrylate and 1-(3-aminosulfonylphenylnaphthyl) acrylate; and methacrylates such as o-aminosulfonylphenyl methacrylate, m-aminosulfonylphenyl methacrylate, p-aminosulfonylphenyl methacrylate and 1-(3-aminosulfonylphenylnaphthyl) methacrylate;

(4) Phenylsulfonylacrylamides, which may have substituent groups, such as tosylacrylamide, and phenylsulfonylmethacrylamides, which may have substituent groups, such as tosylmethacrylamide;

(5) Acrylates or methacrylates having aliphatic hydroxyl groups, for example, 2-hydroxyethyl acrylate or 2-hydroxyethyl methacrylate;

(6) (Substituted) acrylates such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate;

(7) (Substituted) methacrylates such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N-dimethylaminoethyl methacrylate;

(8) Acrylamides or methacrylamides such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide;

(9) Vinyl ethers such as ethyl vinyl ether, 2-chloroethyl vinyl ether, hydroxyethyl vinyl ether, propyl vinyl ethers, butyl vinyl ether, octyl vinyl ether and phenyl vinyl ether;

(10) Vinyl esters such as vinyl acetate, vinyl chloroacetate, vinyl butylate and vinyl benzoate;

(11) Styrene derivatives such as styrene, α-methylstyrene, methylstyrene and chloromethylstyrene;

(12) Vinyl ketones such as methyl vinyl ketone, ethyl vinyl ketone, propyl vinyl ketone and phenyl vinyl ketone;

(13) Olefins such as ethylene, propylene, isobutylene, butadiene and isoprene; and

(14) N-vinylpyrrolidone, N-vinylcarbazole, 4-vinylpyridine, acrylonitrile and methacrylonitrile.

Such alkali-soluble film-forming resins can be used either alone or as a combination of two or more of them, and are added in an amount of 50% by weight or less, based on the total light-sensitive composition.

It is preferred that the above-mentioned copolymers have a molecular weight of 10,000 to 100,000. Further, polyvinyl butyral resins, polyurethane resins, polyamide resins and epoxy resins may be added to the above-mentioned copolymers as needed.

Such alkali-soluble polymer compounds can be used either alone or as a combination of two or more of them, and are added in an amount of 40% by weight or less, based on the total light-sensitive composition.

[o-Quinonediazide Compounds]

As the o-naphthoquinonediazide compound that is one main ingredient of the light-sensitive layer of the presensitized plate to which the present invention is applied, an o-quinonediazidosulfonic acid ester of a polyhydroxy compound is preferred. Examples of such polyhydroxy compounds include pyrogallol, acetone resins, phenol-formaldehyde resins, cresol-formaldehyde resins, hydroxystyrene resins and halogenated hydroxystyrene resins. When the 0-naphthoquinonediazide compound is synthesized from the polyhydroxy compound, preferably 0.2 to 1.2 equivalents, more preferably 0.3 to 1.0 equivalent of 1,2-diazonaphthoquinonesulfonic acid chloride is reacted, based on the hydroxyl group of the polyhydroxy compound. As 1,2-diazonaphthoquinonesulfonic acid chloride, there can be used 1,2-diazonaphthoquinone-5-sulfonic acid chloride or 1,2-diazonaphthoquinone-4-sulfonic acid chloride.

The resulting o-naphthoquinonediazide compound is a mixture of compounds variously different in the position and the amount of 1,2-diazonaphthoquinonesulfonate groups introduced. The ratio of a compound in which all hydroxyl groups are converted to 1,2-diazonaphthoquinonesulfonate to the mixture (the content of a completely esterified compound) is preferably 5 mol % or more, and more preferably from 20 mol % to 99 mol %. Specific examples of the o-quinonediazide compounds include compounds described in JP-A-51-139402, JP-A-58-150948, JP-A-58-203434, JP-A-59-165053, JP-A-60-121445, JP-A-60-134235, JP-A-60-163043, JP-A-61-118744, JP-A-62-10645, JP-A-62-10646, JP-A-62-153950, JP-A-62-178562, JP-A-64-76047, U.S. Pat. Nos. 3,102,809, 3,126,281, 3,130,047, 3,148,983, 3,184,310, 3,188,210 and 4,639,406.

The amount of the o-quinonediazide compound contained in the light-sensitive composition of the presensitized plate to which the present invention is applied is suitably from 10% to 50% by weight, and more preferably from 15% to 40% by weight, based on the total amount of the light-sensitive composition.

[Ink-Receptivity Agents]

For improving ink-receptivity, it is preferred that a condensation product of formaldehyde and a phenol having an alkyl group with 3 to 8 carbon atoms as a substituent, such as a t-butylphenol-formaldehyde resin or an octylphenol-formaldehyde resin as described in U.S. Pat. No. 4,123,279, is used simultaneously.

[Development Accelerators]

For enhancing development activity, it is preferred that cyclic acid anhydrides, phenols and organic acids are added to the light-sensitive compositions of the presensitized plates to which the present invention is applied.

Examples of the cyclic acid anhydrides which can be used include phthalic anhydride, tetrahydrophthalic anhydride, hexahydrophthalic anhydride, 3,6-endooxy-Δ$^4$-tetrahydrophthalic anhydride, tetrachlorophthalic anhydride, maleic anhydride, chloromaleic anhydride, α-phenylmaleic anhydride, succinic anhydride and pyromellitic anhydride described in U.S. Pat. No. 4,115,128.

Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

The organic acids are sulfonic acids, sulfinic acids, alkylsulfuric acids, phosphonic acids, phosphates and carboxylic acids described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 1,4-cyclohexene-2,2-dicaroxylic acid, erucic acid, lauric acid, n-undecanoic acid and ascorbic acid.

The amounts of the above-mentioned cyclic acid anhydrides, phenols and organic acids contained in the light-sensitive compositions are preferably from 0.05% to 15% by weight, and more preferably from 0.1% to 5% by weight.

[Development Stabilizers]

For expanding processing stability to the development conditions (so-called development latitude), nonionic surfactants as described in JP-A-62-251740 and JP-A-4-68335 and amphoteric surfactants as described in JP-A-59-121044 and JP-A-4-13149 can be added to the light-sensitive compositions of the presensitized plates to which the present invention is applied.

Specific examples of the nonionic surfactants include sorbitan tristearate, sorbitan monopalmitate, sorbitan trioleate, stearic acid monoglyceride, polyoxyethylene sorbitan monooleate and polyoxyethylene nonyl phenyl ether.

Specific examples of the amphoteric surfactants include alkyldi(aminoethyl)glycines, alkylpolyaminoethylglycine hydrochlorides, 2-alkyl-N-carboxyethyl-N-hydroxyethyl-imidazoliniumbetaine, N-tetradecyl-N,N-betaine type surfactants (for example, Amorgen K (trade name) manufactured by Dai-ichi Kogyo Seiyaku Co., Ltd.) and alkylimidazoline surfactants (for example, Revon 15 (trade name) manufactured by Sanyo Chemical Industries, Ltd.).

The amounts of the above-mentioned nonionic and amphoteric surfactants contained in the light-sensitive compositions are preferably from 0.05% to 15% by weight, and more preferably from 0.1% to 5% by weight.

[Printing Out Agents and Dyes]

Printing out agents for obtaining visible images immediately after exposure and dyes or pigments as image coloring agents can be added to the light-sensitive compositions of the presensitized plates to which the present invention is applied.

Typical examples of the printing out agents include a combination of compounds releasing acids by exposure to light (photo-acid releasing agents) with organic dyes which can form salts. Specific examples thereof include a combination of o-naphthoquinonediazide-4-sulfonic acid halogenides with salt-forming organic dyes described in JP-A-50-36209 and JP-A-53-8128, and trihalomethyl compounds with salt-forming organic dyes described in JP-A-53-36223, JP-A-54-74728, -JP-A-60-3626, JP-A-61-143748, JP-A-61-151644 and JP-A-63-58440. Such trihalomethyl compounds include oxazole compounds and triazine compounds, both of which are excellent in aging stability and give clear printed-out images.

Besides the salt-forming organic dyes described above, other dyes can also be used as the image coloring agents. Suitable dyes are oil-soluble dyes and basic dyes, including the salt-forming organic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (the above are manufactured by Orient Kagaku Kogyo Co., Ltd.), Victoria Pure Blue, Crystal Violet (CI 42555), Methyl Violet (CI 42535), Ethyl Violet, Rhodamine B (CI 145170B), Malachite Green (CI 42000) and Methylene Blue (CI 52015). Dyes described in JP-A-62-293247 are particularly preferred.

[Coating Solvents]

The light-sensitive layers of the presensitized plates to which the present invention is applied are formed by coating on aluminum plates solutions obtained by dissolving the above-mentioned compositions in solvents. Organic solvents as described in JP-A-62-251739 are used alone or as a mixture thereof.

The light-sensitive compositions to which the present invention is applied are dissolved or dispersed at a solid component concentration of 2% to 50% by weight, and applied onto supports, followed by drying.

[Amount Coated]

It is preferred that the amount coated of the light-sensitive composition layers (light-sensitive layers) formed on supports is generally from 0.3 g/m$^2$ to 4.0 g/m$^2$ by weight after drying, although it varies depending on their use. A smaller amount of exposure is required for obtaining images with a decrease in the amount coated, but film strength is decreased. On the other hand, a larger amount of exposure is required with an increase in the amount coated, but light-sensitive films are strengthened and when used as printing plates, the printing plates obtained are high in the number of printable sheets (high in printing durability).

[Improvement in Light-Sensitive Layer Quality]

Surfactants for improving light-sensitive layer quality, for example, fluorine surfactants as described in JP-A-62-170950, can be added to the light-sensitive layers of the presensitized plates to which the present invention is applied. The amount added is preferably from 0.001% to 1.0% by weight, and more preferably from 0.005% to 0.5% by weight, based on the total light-sensitive composition.

[Matte Layers]

Matte layers are preferably formed on surfaces of the light-sensitive layers formed as described above, for shortening the time of vacuum drawing in contact exposure using vacuum printing frames and preventing lack of sharpness in printing. Specifically, there are used a method of providing matte layers as described in JP-A-50-125805, JP-B-57-6582 (the term "JP-B" as used herein means an "examined Japanese patent publication") and JP-B-61-28986, and a method of thermally fusing solid powders described in JP-B-62-62337.

[Supports]

The supports used in the presensitized plates to which the present invention is applied are dimensionally stable plate-shaped materials. Examples of such supports include paper, paper laminated with plastics (for example, polyethylene, polypropylene and polystyrene) and metal plates such as aluminum (including aluminum alloys), zinc, iron and copper plates. In particularly, the effects of the present invention are significantly exhibited in the metal plates such as the aluminum plate. Preferred examples of the aluminum plates include a pure aluminum plate and alloy plates mainly composed of aluminum and containing foreign elements in slight amounts. Further, plastic films laminated or vapor deposited with aluminum may be used. Examples of the foreign elements contained in the aluminum alloys include silicon, iron, manganese, copper, magnesium, chromium, zinc, bismuth, nickel and titanium. The content of the foreign elements in the alloys is 10% by weight or less. Although aluminum particularly suitable in the present invention is pure aluminum, it is difficult in respect to refining technology to produce completely pure aluminum. Accordingly, aluminum may slightly contain foreign elements. Like this, the aluminum plates applied to the present invention are not specified in their composition, and the aluminum plates of conventional raw materials well known in the art can be appropriately utilized. The thickness of the aluminum plates used in the present invention is from about 0.1 mm to about 0.6 mm.

Prior to surface roughening of the aluminum plates, degreasing treatment for removing rolling oil on surfaces thereof is conducted, for example, with surfactants, organic solvents or alkaline aqueous solutions, if desired. First, the surfaces of the aluminum plates are subjected to surface roughening treatment. Methods thereof include methods of mechanically roughening the surfaces, methods of electrochemically roughening the surfaces by dissolution and methods of chemically selectively dissolving the surfaces. As the mechanical methods, there can be used well-known methods such as ball polishing, brushing, blasting and buffing can be used. The electrochemical surface roughening methods include methods of roughening the surfaces in electrolytic solutions of hydrochloric acid or nitric acid with alternating current or direct current. Further, methods in which both are combined as described in JP-A-54-63902 can also be utilized.

The aluminum plates thus roughened are subjected to alkali etching treatment and neutralizing treatment as needed, followed by anodic oxidization for enhancing the water receptivity and the wear resistance of the surfaces, as desired.

As electrolytes used in anodic oxidization of the aluminum plates, there can be used any electrolytes, as long as they can form porous oxide films. In general, sulfuric acid, phosphoric acid, oxalic acid, chromic acid and mixed acids thereof are used. The concentration of the electrolyte can be appropriately determined depending on the kind of electrolyte.

The conditions of anodic oxidation can not be specified without reservation, because they vary depending on the kind of electrolyte. However, an electrolyte concentration within the range of 1% to 80% by weight, a solution temperature within the range of 5° C. to 70° C., a current density within the range of 5 A/dm$^2$ to 60 A/dm$^2$, a voltage within the range of 1 V to 100 V and an electrolytic time within the range of 10 seconds to 5 minutes are generally proper. The amount of anodic oxide films is preferably 1.0 g/m$^2$ or more, and particularly from 2.0 g/m$^2$ to 6.0 g/m$^2$. Less than 1 g/m$^2$ results in insufficient printing durability or easy generation of scratches in non-image areas of the lithographic printing plates, which causes a tendency to form so-called "scratching stains" due to adhesion of ink to the scratches upon printing.

The dissolution behavior of aluminum in development varies depending on the surface treatment conditions of the supports. When the degree of treatment is larger than the range of the above-mentioned conditions, the dissolution amount of aluminum from the supports is increased to cause an increase in the elution amount of additives of aluminum materials, such as silicon, iron, manganese, copper, magnesium, chromium, zinc, bismuth, nickel and titanium, resulting in an error factor in measuring the tracing substances.

After the anodic oxidation treatment, the surfaces of the aluminum plates are subjected to hydrophilization treatment as needed. The hydrophilization treatment methods used in the present invention include a method using alkali metal silicates (for example, an aqueous solution of sodium silicate), as described in U.S. Pat. Nos. 2,714,066, 3,181,461 and 3,280,734. In this method, the supports are immersed or hydrolyzed in the aqueous solution of sodium silicate.

In addition, a method is used in which the supports are treated with potassium fluorozirconate as disclosed in JP-B-36-22063, or with polyvinylphosphonic acid as disclosed in U.S. Pat. Nos. 3,276,868, 4,153,461 and 4,689,272.

The above-mentioned hydrophilization treatment has the effect of preventing aluminum of the supports from being dissolved, thereby also giving the effect of inhibiting an error in measuring the amount of the tracing substances.

[Organic Undercoat Layers]

The supports can be provided with organic undercoat layers described in JP-A-5-45885 prior to coating of the light-sensitive layers, as needed. The above-mentioned undercoat layers have the effect of preventing aluminum of the supports from being dissolved, thereby also giving the effect of inhibiting an error in measuring the amount of the tracing substances.

[Backcoats]

Backcoats are formed on the back sides of the supports as desired. As such backcoats, there are preferably used covering layers comprising organic polymers described in JP-A-5-45885 and metal oxides obtained by hydrolysis and polycondensation of organic or inorganic metal compounds described in JP-A-6-35174.

Of these covering layers, alkoxy compounds of silicon such as $Si(OCH_3)_4$, $Si(OC_2H_5)_4$, $Si(OC_3H_7)_4$ and $Si(OC_4H_9)_4$ are particularly preferred, because they are inexpensive and easily available, and the covering layers of metal oxides obtained therefrom are excellent in developing solution resistance.

The above-mentioned backcoats have the effect of preventing aluminum of the supports from being dissolved, thereby also giving the effect of inhibiting an error in measuring the amount of the tracing substances.

[Negative Working Presensitized Plates]

The negative working presensitized plates to which the developing solutions and the development replenishers in the present invention are preferably applied include those having light-sensitive diazo compound-containing light-sensitive layers, photopolymerizable light-sensitive layers and photocrosslinkable light-sensitive layers. Particularly preferred examples thereof include presensitized plates having negative working light-sensitive layers described in detail in JP-A-6-282079.

[Photopolymerizable Presensitized Plates]

The photopolymerizable presensitized plates to which the developing solutions and the development replenishers in the present invention are preferably applied include those containing photopolymerizable light-sensitive layers and overcoat layers (protective layers) for protecting the light-sensitive layers. Particularly preferred examples thereof include presensitized plates having photopolymerizable light-sensitive layers described in detail in JP-A-10-282682.

[Infrared-Sensitive Presensitized Plates]

The positive working infrared-sensitive presensitized plates to which the developing solutions and the development replenishers in the present invention are preferably applied include those comprising light-sensitive layers containing binders such as cresol resins, substances absorbing light to generate heat, and substances thermally decomposable and decreasing the solubility of the above-mentioned binders in their undecomposed state. Particularly preferred examples thereof include presensitized plates having infrared-sensitive layers described in detail in JP-A-7-285275.

The negative working infrared-sensitive presensitized plates include those comprising light-sensitive layers containing compounds which are decomposed by light or heat to generate acids, crosslinking agents which are crosslinked by the acids, at least one of alkali-soluble resins and infrared absorbing agents. Particularly preferred examples thereof include presensitized plates having infrared-sensitive layers described in detail in JP-A-7-20625 and JP-A-11-218903.

[Development and After-Treatment]

The presensitized plates to which the present invention is applied are exposed through transparent original images to active rays whose light sources are carbon arc lamps, mercury lamps, metal halide lamps, xenon lamps and tungsten lamps, or exposed through digital data of computers and the like using solid or semiconductor lasers and heat treated, followed by development processing with the developing solutions to which the present invention is applied.

The presensitized plates subjected to such development processing are after-treated with washing water, rinsing solutions containing surfactants, finishers mainly composed of gum arabic and starch derivatives, and protective gum solutions. For the after-treatment of the presensitized plates of the present invention, these treating methods can be used in various combinations.

Recently, in the plate-making and printing industries, automatic developing processors for presensitized plates have been widely used for rationalization and standardization of plate-making operations. Each of these automatic developing processors generally comprises a development unit, an after-treatment unit, a device for transporting a presensitized plate, respective processing solution tanks and spraying units, and respective pumped-up processing solutions are sprayed on the exposed presensitized plate from spray nozzles while horizontally transporting the presensitized plate to conduct development and after-treatment. Further, recently, a process of immersing and transporting a presensitized plate in a processing tank filled with a processing solution by means of guide rolls provided in the solution tank to conduct development processing, and a process of supplying a small constant amount of washing water to a plate surface after development to wash it with water, and recycling the waste water as diluent water for a stock solution of a developing solution have also been known.

In such automatic development processing, processing can be performed while replenishing each replenisher to each processing solution depending on the processing amount and operating time. A development replenishing method described in JP-A-9-274324 can be preferably applied to the present invention.

The lithographic printing plates obtained by such processing are set on an offset press to print a number of sheets.

The developing solutions and development replenishers to which the present invention is applied will be described in detail below.

The tracing substances contained in the developing solutions and/or development replenishers, not in the light-sensitive layers, will be described below.

[Tracing Substances]

As described above, the developing solutions and development replenishers to which the present invention is applied are characterized in that they contain trace elements and their compounds as the tracing substances. As such elements constituting the tracing substances, any elements can be used in the present invention, as long as they are not contained in main ingredients of the developing solutions. For example, in the developing solution containing potassium silicate as a main ingredient, examples of the elements include lithium, beryllium, boron, sodium, magnesium, aluminum, phosphorus, sulfur, calcium, scandium, titanium, vanadium, chromium, manganese, iron, cobalt, nickel, copper, zinc, gallium, germanium, arsenic, selenium, rubidium, strontium, yttrium, zirconium, niobium, molybdenum, ruthenium, rhodium, palladium, silver, cadmium, indium, tin, antimony, tellurium, cesium, barium, lanthanum, cerium, praseodymium, neodymium, europium, gadolinium, terbium, dysprosium, holmium, erbium, thulium, ytterbium, lutetium, hafnium, tantalum, tungsten, rhenium, osmium, iridium, platinum, gold, mercury, thallium, lead and bismuth. When the main ingredient is sodium silicate, potassium is preferably used, and when the main ingredient is sugar/alkali, silicon is preferably used. Of these, elements suffering little contamination from dilution water, washing water and air and causing no problem with regard to environmental contamination are preferred, and lithium, boron, phosphorus, sulfur, titanium, strontium, yttrium, zirconium, niobium, molybdenum, tungsten and bismuth are preferred because of their inexpensiveness and good general-purpose properties. Further, sodium, magnesium, potassium, calcium and silicon which are anticipated to suffer contamination from dilution water, washing water and air can also be used by selecting the concentration thereof added.

There is no particular limitation on the form of the compound added, as long as it does not affect on the performance of the developing solution, and any compound can be preferably used, as long as it is stable under alkaline conditions. Examples thereof include inorganic salts such as oxides, hydroxides, halides, sulfates, nitrates, phosphates and carbonates; and organic acid salts such as formats, acetates, propionates, maleates, lactates, levulinates, malonates, adipates and fumarates. For enhancing the solubility of the above-mentioned compounds, complex forming agents forming chelate compounds with elements in the solutions can also be added. The complex forming agents include, for example, hydroxyl group- or carboxyl group-containing nitrogen compounds and phenols. They can also be added in the alkali-soluble complex form. Examples of complex-forming ligands include, for example, monodentate ligands such as $NH_3$, $OH_2$, $NO^-$, $NO_2^-$, $NO_3^-$, $CN^-$, $SCN^-$, $Br-$, $Cl^-$, $F^-$, $I^-$, $CO_2$ and $CO$; and multidentate ligands such as ethylenediamine, $C_2O_4^{2-}$, $HOCN(CH_3)=C(CH_3)NO$, $OC(N_2)_2$, $NH_2CH_2COO^-$, ethylenediaminetetraacetic acid, diethylenetriamine, triethylenetetramine, bipyridine, 1,10-phenanthroline, diethylenetriaminepentaacetic acid, triethylenetetraminehexaacetic acid, hydroxyethylethylenediaminetriacetic acid, nitrilotriacetic acid, 1,2-diaminocyclohexanetetraacetic acid, 1,3-diaminocyclohexanetetraacetic acid, 1,3-diamino-2-propanoltetraacetic acid and organic phosphonic acids such as 2-phosphonobutane-1,2,4-tricarboxylic acid, aminotri (methylenephosphonic acid), 1-hydroxyethylidene-1,1-diphosphonic acid, 3,3-diphosphonopimelic acid, $(PO_3H_2)NCH_2CH_2N-(CH_2PO_3H_2)_2$ and $N(CH_2PO_3H_2)_3$. The concentration of these tracing substances contained in the developing solutions and development replenishers is preferably from 0.1 mg/L to 10,000 mg/L, and more preferably from 1 mg/L to 500 mg/L. Less than this range causes too large an error in measurement to obtain a precise ingredient concentration, whereas exceeding this range results in the difficulty of highly concentrating the solutions and introduces the problem of increased cost.

Then, other common ingredients will be described which are contained in the developing solutions and development replenishers when the tracing substances are added to the light-sensitive layers, or the developing solutions and/or development replenishers.

[Alkali Agents]

The developing solutions and/or development replenishers to which the present invention is applied are aqueous alkali solutions having a pH of 10.0 to 13.5, and preferably a pH of 12.0 to 13.3. As such developing solutions and/or development replenishers, conventionally known aqueous alkali solutions can be used. Examples of the alkali agents used in the solutions include inorganic alkali agents such as sodium silicate, potassium silicate, ammonium silicate, lithium-silicate, trisodium-phosphate, tripotassium-phosphate, disodium phosphate, dipotassium phosphate, diammonium phosphate, sodium bicarbonate, potassium bicarbonate, ammonium bicarbonate, sodium carbonate, potassium carbonate, ammonium carbonate, sodium hydrogencarbonate, potassium hydrogencarbonate, ammonium-hydrogencarbonate, sodium-borate, potassium borate, ammonium borate, sodium hydroxide, potassium hydroxide, ammonium hydroxide and lithium hydroxide. They also include organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

Of these alkali agents, preferred are aqueous solutions of silicates such as sodium silicate and potassium silicate. The reason for this is that the pH and development properties are adjustable by the molar ratio of silicon oxide $SiO_2$ that is a main ingredient of the silicates to an alkali metal oxide $M_2O$ (generally represented by $[SiO_2]/[M_2O]$) and the concentration thereof. The $SiO_2/M_2O$ molar ratio of the alkali silicates (M represents an alkali metal or ammonium) is from 0.5 to 3.0, and preferably from 1.0 to 2.0. As the molar ratio of the alkali silicates increases larger than 3.0, the development properties deteriorate. On the other hand, as the molar ratio decreases lower than 0.5, the alkalinity becomes high, which causes an adverse effect in etching metals of aluminum plates that are supports of light-sensitive plates. The content of the alkali silicates in the developing solutions is from 1% to 10% by weight, and preferably from 1.5% to 7% by weight. Exceeding 10% by weight results in liability to formation of precipitates and crystals, and a tendency to gel in neutralizing wastewater.

Other preferred examples of the alkali agents include buffer solutions comprising weak acids and strong bases. The weak acids used in such buffer solutions have preferably an acid dissociation constant (pKa) of 10.0 to 13.3, and particularly preferably have a pKa of 11.0 to 13.1. For example, sulfosalicylic acid has an acid dissociation constant of 11.7, and is preferably used in the present invention. That is to say, in the case of a polybasic acid, it can be used in the present invention, as long as at least one acid dissociation constant thereof is within the above-mentioned range.

Such weak acids are selected from ones described in *Ionization Constants of Organic Acids in Aqueous Solution* published by Pergamon Press, and include, for example, alcohols such as 2,2,3,3-tetrafluoropropanol-1 (pKa 12.74), trifluoroethanol (pKa 12.37) and trichloroethanol (pKa 12.24); aldehydes such as pyridine-2-aldehyde (pKa 12.68) and pyridine-4-aldehyde (pKa 12.05); saccharides such as sorbitol (pKa 13.0), saccharose (pKa 12.7), 2-deoxyribose (pKa 12.61), 2-deoxyglucose (pKa 12.51), glucose (pKa 12.46), galactose (pKa 12.35), arabinose (pKa 12.34), xylose (pKa 12.29), fructose (pKa 12.27), ribose (pKa 12.22), mannose (pKa 12.08) and L-ascorbic acid (pKa 11.34); phenolic hydroxyl group-containing compounds such as salicylic acid (pKa 13.0), 3-hydroxy-2-naphthoic acid (pKa 12.84), catechol (pKa 12.6), gallic acid (pKa 12.4), sulfosalicylic acid (pKa 11.7), 3,4-dihydroxybenzoic acid (pKa 11.94), 1,2,4-trihydroxybenzene (pKa 11.82), hydroquinone (pKa 11.56), pyrogallol (pKa 11.34) and resorcinol (pKa 11.27); oximes such as 2-butanone oxime (pKa 12.45), acetoxime (pKa 12.42), 1,2-cycloheptanedione dioxime (pKa 12.3), 2-hydroxybenzaldehyde oxime (pKa 12.10), dimethylglyoxime (pKa 11.9), ethanediamidodioxime (pKa 11.37) and acetophenone oxime (pKa 11.35); amino acids such as 2-quinolone (pKa 11.76), 2-pyridone (pKa 11.65), 4-quinolone (pKa 11.28), 4-pyridone (pKa 11.12), 5-aminovaleric acid (pKa 10.77), 2-mercaptoquinoline (pKa 10.25) and 3-aminopropionic acid (pKa 10.24); and nucleic acid-relating substances such as fluorouracil (pKa 13.0) guanosine (pKa 2.6),uridine (pKa 2.6), adenosine (pKa2.56), inosine (pKa 12.5), guanine (pKa 12.3), cytidine (pKa 12.2), cytosine (pKa 12.2), topoxanthine (pKa 12.1) and-xanthine (pKa 11.9). In addition, they further include weak acids such as diethylaminomethylphosphonic acid (pKa 12.32), 1-amino-3,3,3-trifluorobenzoic acid (pKa 12.29), isopropylidenediphosphonic acid (pKa 12.10), 1,1-ethylidene-diphosphonic acid (pKa 11.54), 1,1-ethylidenediphosphonic acid 1-hydroxy (pKa 11.52), benzimidazole (pKa 12.86), thiobenzamide (pKa 12.8), picolinethioamide (pKa 12.55) and barbituric acid (pKa 12.5). As the bases combined with these weak acids, there are used sodium hydroxide, ammonium hydroxide, potassium hydroxide and lithium hydroxide.

These alkali agents can be used either alone or as a combination of two or more of them. Of these alkali buffering agents, preferred are combinations of sulfosalicylic acid, salicylic acid, saccharose and sorbitol with sodium hydroxide and potassium hydroxide. Particularly preferred is a combination of sorbitol with sodium hydroxide or potassium hydroxide.

The above-mentioned various alkali agents are used after adjustment of the pH within a preferred range by changing their concentration and combination.

[Surfactants]

For accelerating the development properties and enhancing dispersion of development scum and the ink affinity of image areas of the printing plates, various surfactants and organic solvents can be added as required. Preferred examples of the surfactants include anionic, cationic, nonionic and amphoteric surfactants.

Preferred examples of the surfactants include nonionic surfactants such as polyoxyethylene alkyl ethers, polyoxyethylene alkyl phenyl ethers, polyoxyethylene polystyryl phenyl ethers, polyoxyethylene polyoxypropylene alkyl ethers, glycerol fatty acid partial esters, sorbitan fatty acid partial esters, pentaerythritol fatty acid partial esters, propylene glycol fatty acid monoesters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenized caster oils, polyoxyethylene glycerol fatty acid partial esters, fatty acid diethanolamides, N,N-bis-2-hydroxyalkylamines, polyoxyethylenealkylamines, triethanolamine fatty acid esters and trialkylamine oxides; anionic surfactants such as fatty acid salts, abietates, hydroxyalkanesulfonates, alkanesulfonates, dialkylsulfosuccinates, straight chain alkylbenzenesulfonates, branched chain alkylbenzenesulfonates, alkylnaphthalenesulfonates, alkylphenoxypolyoxyethylenepropylsulfonates, polyoxyethylenealkylsulfophenyl ether salts, N-methyl-N-oleyltaurine sodium salt, N-alkylsulfosuccinic acid monoamide disodium salts, petroleum sulfonic acid salts, sulfated tallow, sulfates of fatty acid alkyl esters, alkylsulfates, polyoxyethylene alkyl ether sulfates, fatty acid monoglyceride sulfates, polyoxyethylene alkyl phenyl ether sulfates, polyoxyethylene styryl phenyl ether sulfates, alkyl phosphates, polyoxyethylene alkyl ether phosphates, polyoxyethylene alkyl phenyl ether phosphates, partially saponified products of styrene/maleic anhydride copolymers, partially saponified products of olefin/maleic anhydride copolymers and formalin-condensed products of naphthalenesulfonates; cationic surfactants such as alkylamine salts, quaternary ammonium salts such as tetrabutylammonium bromide, polyoxyethylenealkylamine salts and polyethylenepolyamine derivatives; and amphoteric surfactants such as carboxybetaines, aminocarboxylic acids, sulfobetaines, aminosulfates and imidazolines. In the surfactants described above, "polyoxyethylene" can also be read as "polyoxyalkylene" such as polyoxymethylene, polyoxypropylene or polyoxybutylene, which is also included in "polyoxyethylene".

Fluorine surfactants containing perfluoroalkyl groups in their molecules are more preferred. Examples of such fluorine surfactants include anionic surfactants such as perfluoroalkylcarboxylates, perfluoroalkylsulfonates and perfluoroalkylphosphates; amphoteric surfactants such as perfluoroalkylbetaines; cationic surfactants such as perfluoroalkyltrimethylammonium salts; and nonionic surfactants such as perfluoroalkylamine oxides, perfluoroalkyl ethylene oxide adducts, oligomers containing perfluoroalkyl groups and hydrophilic groups, oligomers containing perfluoroalkyl groups and lipophilic groups, oligomers containing perfluoroalkyl groups, hydrophilic groups and lipophilic groups, and urethanes containing perfluoroalkyl groups and lipophilic groups.

The above-mentioned surfactants can be used either alone or as a combination of two or more of them, and are added to the developing solutions within the range of 0.001% to 10% by weight, more preferably within the range of 0.01% to 5% by weight.

[Development Stabilizers]

Various development stabilizers are used in the developing solutions and development replenishers to which the present invention is applied. Preferred examples thereof include polyethylene glycol adducts of sugar alcohols described in JP-A-6-282079, tetraalkylammonium salts such as tetrabutylammonium hydroxide, phosphonium salts such as tetrabutylphosphonium bromide, and iodonium salts such as diphenyliodonium chloride.

They further include anionic surfactants or amphoteric surfactants described in JP-A-50-51324, water-soluble cationic polymers described in JP-A-55-95946 and water-soluble amphoteric polyelectrolytes described in JP-A-56-142528.

Furthermore, they include alkylene glycol-added organic boron compounds described in JP-A-59-84241, polyoxyethylene-polyoxypropylene block copolymer type water-soluble surfactants described in JP-A-60-111246, polyoxyethylene-polyoxypropylene-substituted alkylenediamine compounds described in JP-A-60-129750, polyethylene glycol having a weight average molecular weight of 300 or more as described in JP-A-61-215554, fluorine-containing surfactants having cationic groups as described in JP-A-63-175858, water-soluble ethylene oxide addition compounds obtained by adding 4 moles or more of ethylene oxide to acids or alcohols as described in JP-A-2-39157, and water-soluble polyalkylene compounds.

[Organic Solvents]

Organic solvents are further added to the developing solution and development replenishers as needed. Such organic solvents suitably have a solubility in water of about 10% by weight or less, and are preferably selected from ones having a solubility of 5% by weight or less. Examples thereof include 1-phenylethanol, 2-phenylethanol, 3-phenyl-1-propanol, 4-phenyl-1-butanol, 4-phenyl-2-butanol, 2-phenyl-1-butanol, 2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 3-methylcyclohexanol, 4-methylcyclohexanol, N-phenylethanolamine and N-phenyldiethanolamine. The content of the organic solvents is from 0.1% to 5% by weight, based on the total weight of the solution used. The amount thereof used is closely related to the amount of the surfactants used, and it is preferred that the amount of the surfactants is increased with an increase in the amount of the organic solvents. This is because when the surfactants are used in small amounts and the organic solvents are used in large amounts, the organic solvents are not completely dissolved, resulting in failure to expect to ensure good development properties.

[Reducing Agents]

Reducing agents are further added to the developing solutions and development replenishers to which the present invention is applied. They prevent the printing plates from being stained, and particularly effective in developing negative working light-sensitive lithographic printing plates containing light-sensitive diazonium salt compounds. Preferred examples of the organic reducing agents include phenol compounds such as thiosalicylic acid, hydroquinone, Metol, methoxyquinone, resorcin and 2-methylresorcin, and amine compounds such as phenylenediamine and phenylhydrazine. Further, preferred examples of the inorganic reducing agents include sodium salts, potassium salts and ammonium salts of inorganic acids such as sulfurous acid, hydrogensulfurous acid, phosphorous acid, hydrogenphosphorous acid, dihydrogenphosphorous acid, thiosulfuric acid and dithionous acid. Of these reducing agents, particularly excellent in stain prevention effect are sulfites. These reducing agents are preferably contained within the range of 0.05% to 5% by weight, based on the developing solution at the time of use.

[Organic Carboxylic Acids]

Further, organic carboxylic acids can also be added to the developing solutions and development replenishers to which the present invention is applied. The organic carboxylic acid is preferably an aliphatic or aromatic carboxylic acid having 6 to 20 carbon atoms. Specific examples of the aliphatic carboxylic acids include caproic acid, enanthylic acid, caprylic acid, lauric acid, myristic acid, palmitic acid and stearic acid, and particularly, an alkanoic acid having 8 to 12 carbon atoms is preferred. Further, they may be either unsaturated fatty acids having double bonds in carbon chains or aliphatic carboxylic acids having branched carbon chains.

The aromatic carboxylic acids are compounds in which benzene rings, naphthalene rings and anthracene rings have carboxyl groups as substituent groups, and specific examples thereof include o-chlorobenzoic acid, p-chlorobenzoic acid, o-hydroxybenzoic acid, p-hydroxybenzoic acid, o-aminobenzoic acid, p-aminobenzoic acid, 2,4-dihydroxybenzoic acid, 2,5-dihydroxybenzoic acid, 2,6-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid. The hydroxynaphthoic acids are particularly effective.

The above-mentioned aliphatic and aromatic carboxylic acids are preferably used as sodium salts, potassium salts or ammonium salts for enhancing their water solubility. There is no particular limitation on the content of the organic carboxylic acids in the developing solutions used in the present invention. However, less than 0.1% by weight results in insufficient effect, whereas exceeding 10% by weight not only results in failure to more improve the effect, but also sometimes prevents other additives from being dissolved when they are used in combination. Accordingly, the amount added is preferably from 0.1% to 10% by weight, and more preferably from 0.5% to 4% by weight, based on the developing solution at the time of use.

[Others]

The developing solutions and development replenishers to which the present invention is applied can also further contain preservatives, coloring agents, thickeners, antifoaming agents and hard-water softeners, as required. Examples of the hard-water softeners include polyphosphoric acids, and sodium salts, potassium salts and ammonium salts thereof; aminopolycarboxylic acids such as ethylenediaminetetraacetic acid, diethylenetriaminepentaacetic acid, triethylenetetraminehexaacetic acid, hydroxyethylethylenediaminetriacetic acid, nitriloacetic acid, 1,2-diaminocyclohexanetetraacetic acid and 1,3-diamino-2-propanoltetraacetic acid, and sodium salts, potassium salts and ammonium salts thereof; and aminotri (methylenephosphonic acid), ethylenediaminetetra (methylenephosphonic acid), diethylenetriaminepenta (methylenephosphonic acid), triethylenetetraminehexa (methylenephosphonic acid), hydroxyethylethylenediaminetri(methylenephosphonic acid) and 1-hydroxyethane-1,1-diphosphonic acid, and sodium salts, potassium salts and ammonium salts thereof.

Although the optimum value of such hard-water softeners varies according to their chelating power, and the hardness and amount of hard water used, the general amount thereof used ranges from 0.01% to 5% by weight, and more preferably from 0.01% to 0.5% by weight, based on the developing solution at the time of use. When the amount added is less than this range, the desired objects are not sufficiently attained. On the other hand, when the amount added is more than this range, a bad influence such as blank color spots is generated on image area.

Although the residual ingredient of the developing solutions and development replenishers is water, various additives known in the art can be further added, as needed.

In respect to transportation, it is advantageous that the developing solutions and development replenishers are concentrated to a water content lower than at the time of use and the concentrated solutions are diluted with water at the time of use. In this case, it is suitable that the degree of concentration is such a degree that the respective ingredients are not separated or not precipitated.

Embodiments of the present invention are described in detail below.

One embodiment derived from the present invention comprises detecting the tracing substance dissolved in the developing solution by tracing substance measurement. The measuring procedure is shown below.

In this embodiment, the amount of the tracing substance in the developing solution is detected with a tracing substance amount detector described later, and the degree of a decrease in development activity previously determined by an experiment is calculated from the detected value using, for example, a computer. Then, the replenishment rate of the replenisher is determined from the calculated value, and a replenishing operation is carried out.

The tracing substance used in this embodiment is inactive to an aqueous alkali solution, so that it can be stably detected in any developing solution. Further, in this embodiment, the replenishment rate of the replenisher can be calculated more precisely by utilizing this tracing substance as compared with the conventional procedures. As a result, the development activity of the developing solution can be kept good and stable.

[Tracing Substance Amount Detectors]

In the automatic developing processor used in the present invention, an automatic developing processor described in JP-A-9-274324 is equipped with a device for sampling the developing solution in a developing tank and a device for detecting the amount of the tracing substance, thereby measuring the amount of the tracing substance in the developing solution, and correcting a replenishing control value.

As the device for sampling the developing solution, there can be used, for example, a pipe for introducing the developing solution contained in the tank to the tracing substance detector and a circulating pump.

In the device for detecting the amount of the tracing substance, a procedure is used that an amount of about 0.1 ppm to about 10,000 ppm is detectable with satisfactory precision. For example, there can be used electrochemical analyzers using voltametry, polarography or ion electrodes; photoanalyzers such as ultraviolet-visible spectrophotometers, atomic emission spectrometers, flame photometers, atomic absorption analyzers and fluorophotometers; chromatographic analyzers using gas chromatography, liquid chromatography, ion chromatography, electrophoresis and super critical chromatography; and plasma mass spectrometers.

Of the above-mentioned detectors, the atomic emission spectrometers are more preferred in which the alkaline developing solutions can be stably measured for a long period of time, the measurement is possible regardless of the compound form of the tracing substances, and many atoms can be concurrently measured for a short period of time.

As the atomic emission spectrometers, it is desirable to use analyzers comprising argon plasma emission units and emission intensity spectral analyzing units. For example, analyzers disclosed in JP-A-10-132746 and JP-A-10-19783 can be used.

Another embodiment derived from the present invention comprises measuring the substitution rate and the concentration rate of the tracing substance using the measurement thereof. Processes of measuring the substitution rate and the concentration rate are described below.

(a) Embodiment of Constitution (3) Described Above:

When the tracing substance (T) is added to the developing solution which has been provided at the beginning of development so as to give a concentration A and to the development replenisher so as to give a concentration B, the substitution rate y can be determined by equation [1]:

A measured value of the concentration of the tracing substance: t $$t=A(1-y)+By \qquad [1]$$

wherein A or B may be 0 (when the tracing substance is added to only one of the solutions, A or B is 0.)

(b) Embodiment of Constitution (4) Described Above:

When the tracing substance (T) is added to the developing solution which has been provided at the beginning of development so as to give a concentration A and to the development replenisher so as to give a concentration B, the substitution rate y can be determined by equation [1]:

A measured value of the concentration of the tracing substance: t $$t=A(1-y)+By \qquad [1]$$

wherein A or B may be 0 (when the tracing substance is added to only one of the solutions, A or B is 0.)

Further, in the automatic developing processor, the operation time and discharge amount of the pump are integrated, thereby otherwise measuring the replenishment rate separately. When a difference arises on comparison with the substitution rate y' obtained from a measured value of the replenishment rate, the occurrence of concentration or dilution is confirmed, and correction is made. For example, the substitution rate y' calculated from the pump is substituted in equitation [1] to determine a theoretical value (t') of the concentration of the trace substance. When t>t' on comparison between the theoretical value (t') and the measured value (t), the occurrence of concentration is confirmed. When t<t', the occurrence of dilution is confirmed. Further, the concentration rate is determined from the t/t' ratio.

(c) Embodiment of Constitution (5) Described Above:

When the tracing substance (Ts) is added to the developing solution which has been provided at the beginning of development so as to give a concentration A and the tracing substance (Tr) is added to the development replenisher so as to give a concentration B, the substitution rate and the concentration rate can be accurately determined without detection of the development replenisher by the operation time and discharge amount of the pump. Accordingly, this embodiment is more preferred. The substitution rate y and the concentration rate x can be determined from equations [3] and [4].

A measured value of the concentration of the tracing substance added to the developing solution: a $$a=\{A(1-y)\}x \qquad [3]$$

A measured value of the concentration of the tracing substance added to the development replenisher: b $$b=(By)x \qquad [4]$$

Further, when there is no change in the concentration rate, equation [5] holds.

$$a/A+b/B=1 \qquad [5]$$

When the left side of equation [5] is more than 1, the occurrence of concentration is confirmed, and when less than 1, the occurrence of dilution is confirmed.

(d) Embodiment of Constitution (6) Described Above:

When the tracing substance (T) is added to the developing solution which has been provided at the beginning of development so as to give a concentration A, and when the concentration of a main development ingredient of the developing solution which has been provided at the beginning of development is S and the concentration of a main development ingredient of the development replenisher is R, the substitution rate y and the concentration rate x can be determined from equations [3] and [6].

A measured value of the concentration of the tracing substance: t $$t=\{A(1-y)\}x \qquad [3]$$

The concentration of a main ingredient: D $$D=\{S(1-y)+Ry\}x \qquad [6]$$

Further, when the tracing substance (T) is added to the development replenisher so as to give a concentration B, and when the concentration of a main development ingredient of the developing solution which has been provided at the beginning of development is S and the concentration of a main development ingredient of the development replenisher is R, the substitution rate y and the concentration rate x can be determined from equations [4] and [6].

A measured value of the concentration of the tracing substance: t $$t=(By)x \qquad [4]$$

The concentration of a main ingredient: D $$D=\{S(1-y)+Ry\}x \qquad [6]$$

(e) Embodiment of Constitution (7) Described Above:

When the concentration of a main development ingredient DS of the developing solution which has been provided at the beginning of development is S and the concentration of a main development ingredient DR of the development replenisher is R, the substitution rate y and the concentration rate x can be determined from equations [7] and [8].

A measured value of the concentration of a main development ingredient DS: s $$s=\{S(1-y)\}x \qquad [7]$$

A measured value of the concentration of a main development ingredient DR: r $$r=(Ry)x \qquad [8]$$

The present invention will be described by reference to examples below.

EXAMPLE I-1

A surface of a 0.24-mm thick aluminum plate was grained with a nylon brush and an aqueous suspension of 400-mesh purmice stone, followed by sufficient washing with water. Then, the plate was immersed in 10% sodium hydroxide at 70° C. for 20 seconds to conduct etching, and further washed with running water, followed by neutralization and washing with 20% $HNO_3$. Subsequently, the plate was washed with water. This was electrolytically surface roughened using alternating waveform current of a sine wave under the conditions of VA=12.7 V in a 0.7% aqueous solution of nitric acid at an electrical quantity of 400 coulombs/$dm^2$. This substrate was subjected to anodic oxidation in a 10% aqueous solution of sodium hydroxide so as to give an aluminum solubility of 0.9g/²at its surface. After washing with water, the substrate was neutralized and washed in a 20% aqueous solution of nitric acid to remove smuts, followed by anodic oxidation in a 18% aqueous solution of $H_2SO_4$ so as to give an oxide film amount of 3 g/$m^2$.

Then, the substrate was immersed in a 2% aqueous solution of J3 sodium silicate at 30° C. for 15 seconds to conduct hydrophilization treatment. The support thus prepared was coated with an undercoat solution a having the following composition so as to give a dry weight of 10 mg/$m^2$, followed by drying at 90° C. for 1 minute to provide an undercoat layer.

| (Undercoat Solution a) | |
|---|---|
| Phenylphosphonic Acid | 0.06 part by weight |
| Sulfuric Acid | 0.12 part by weight |
| Methanol | 100 parts by weight |

Subsequently, a light-sensitive solution a having the following composition was prepared, and a light-sensitive layer a was formed on the substrate so as to give a dry weight of 1.8 g/m$^2$.

| (Light-Sensitive Layer a) | |
|---|---|
| m-Cresol-Formaldehyde Resin (the content of tri- or more nuclear ingredients: 86.5%, molecular weight: 4800) | 1.9 parts by weight |
| Esterified Product of 1,2-Diazonaphthoquinone-5-sulfonyl Chloride and Pyrogallol-Acetone Resin (molecular weight: 2500) | 0.76 parts by weight |
| Tetrahydrophthalic Anhydride | 0.2 part by weight |
| 4-[p-N-(p-Hydrobenzoyl) aminophenyl]-2,6-bis (trichloromethyl)-s-triazine | 0.02 part by weight |
| Victoria Pure Blue BOH (Manufactured by Hodogaya Chemical Co., Ltd.) | 0.03 part by weight |
| Megafac F-177 (Fluorine Surfactant Manufactured by Dainippon Ink & Chemicals, Inc.) | 0.006 part by weight |
| Methyl Ethyl Ketone | 15 parts by weight |
| Propylene Glycol Monomethyl Ether | 15 parts by weight |
| Lithium Acetate (Tracing Substance) | 0.003 part by weight |

A resin solution for forming a matte layer was sprayed on a surface of the light-sensitive layer in the following manner to provide the matte layer, thereby obtaining a presensitized plate A. As the resin solution for forming the matte layer, a 12% aqueous solution of a partial sodium salt of a methyl methacrylate/ethyl acrylate/acrylic acid (charge weight ratio: 65:20:15) copolymer was prepared. The solution was sprayed with a rotary atomizing electrostatic apparatus. The rotation of an atomizing head was 25,000 rpm, the feed rate of the resin solution was 40 ml/minute, the applied voltage to the atomizing head was −90 kV, the ambient temperature in coating was 25° C., and the relative humidity was 50%. 2.5 seconds after coating, vapor was sprayed on the light-sensitive layer to humidify it. Then, 3 seconds after humidification, hot air having a temperature of 60° C. and a humidity of 10% was sprayed on the light-sensitive layer for 5 seconds to dry it. Mattes had a height of about 6 µm, a size of about 30 µm and a number of 150 mattes/mm$^2$.

The presensitized plate A thus obtained was cut to a size of 1003 mm×800 mm to prepare many plates, which were exposed through an original film for 60 seconds using a 3-kW metal halide lamp from a distance of 1 m. Then, an immersion type developing tank of an automatic developing processor was charged with 18 liters of a developing solution having a pH of about 13.0 which was obtained by diluting the following stock developing solution a1 9 times with tap water, followed by heating at 30° C. Tap water was automatically supplied to a washing tank as the second bath, thereby being able to wash the presensitized plates. A finishing solution tank as the third bath, was charged with 4 liters of a finishing solution obtained by diluting FP-2W (manufactured by Fuji Photo Film Co., Ltd.) twice with tap water. Separately, a tank for a stock development replenisher was charged with 5 liters of the following stock development replenisher a2.

In the automatic developing processor, the developing tank was replenished with a development replenisher obtained by diluting the stock development replenisher a2 6.5 times with water in an amount of 35 ml per square meter of a plate processed, in an amount of 130 ml per hour of operation of the automatic developing processor, and in an amount of 20 ml per hour of stoppage. This kept the activity of the developing solution stored in the developing tank approximately constant. The automatic developing processor was equipped with a device for sampling the developing solution in the developing tank and an atomic emission spectrometer as the device for detecting the amount of the tracing substance so that the measurement of the tracing substance is possible, and a program was improved so that the replenishment rate can be corrected. Also in an after-treatment unit, washing water and the finishing solution FP-2W (the solution diluted twice with tap water) were replenished in amounts of 30 ml and 20 ml, respectively, per square meter of a presensitized plate processed.

| (Stock Developing Solution a1) | |
|---|---|
| [SiO$_2$]/[K$_2$O] Molar Ratio: 1.2, SiO$_2$: Aqueous Solution Containing 12.2% by weight of Potassium Silicate | 99.8% by weight |
| Polyoxyethylene (the number of moles added n = 12) Sorbitol Ether | 0.2% by weight |

| (Stock Development Replenisher a2) | |
|---|---|
| [SiO$_2$]/[K$_2$O] Molar Ratio: 1.0 SiO$_2$, Aqueous Solution Containing 19.9% by weight of Potassium Silicate | 99.6% by weight |
| Polyoxyethylene (the number of moles added n = 12) Sorbitol Ether | 0.4% by weight |

The above-mentioned exposed presensitized plates were processed under such conditions at a rate of 50 plates per day, every day excepting Saturday, Sunday and national holidays for 2 months. Then, the amount of lithium that is the tracing substance was measured with the above-mentioned detector, and the replenishment rate was corrected to conduct processing.

The activity was checked by developing the presensitized plate printed with the amount of light stepwise changed using a step tablet (having a difference in optical density per one step of 0.15 and 25 steps), reading the step number of an image left corresponding to the amount of light on the plate, and comparing it with the step number at the beginning of processing. During the test period of 2 months, a clear portion (the image was completely removed) was kept at 5.5 steps, and a solid portion (the image completely remained) was kept at 11.5 steps, thus maintaining stable processing.

COMPARATIVE EXAMPLE I-1

The presensitized plate A was processed and evaluated in the same manner as with Example I-1 with the exception that a light-sensitive layer in which the tracing substance was removed from the light-sensitive layer of Example I-1 was used and the amount of the tracing substance was not measured. In this case, the step number of the step tablet begun to gradually increase about 1 week after the start of the test, although the replenishment was conducted as established.

EXAMPLE I-2

A surface of a 0.30-mm thick aluminum plate was washed and degreased, and then, grained with a rotary nylon brush and an aqueous suspension of 400-mesh pumice stone, followed by sufficient washing with water. Then, the plate was immersed in 25% sodium hydroxide at 45° C. for 9 seconds to conduct etching, and then, washed with running water, followed by neutralization and washing with 20% $HNO_3$. Subsequently, the plate was washed with water. This was provided with 3 g/m² of a direct current anodic oxide film at 15 A/dm² using 7% sulfuric acid as an electrolyte, followed by washing with water and drying. The plate was further treated with an aqueous solution containing 2.5% sodium silicate by weight at 30° C. for 10 seconds, and coated with the following undercoat solution b. The resulting coating film was dried at 80° C. for 15 seconds to obtain a substrate. The amount of the coating film after drying was 15 mg/m².

| (Undercoat Solution b) | |
| --- | --- |
| The Following Compound 1 | 0.3 part by weight |
| Water | 1 part by weight |
| Methanol | 100 parts by weight |

Compound 1

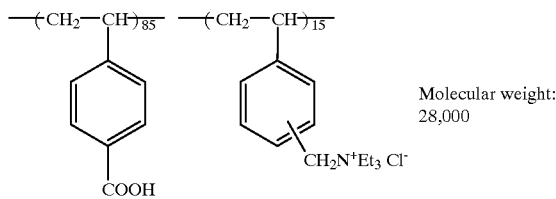

Molecular weight: 28,000

Subsequently, a light-sensitive solution b having the following composition was prepared, and a light-sensitive layer was formed on the above-mentioned substrate so as to give a dry weight of 1.1 g/m², thereby obtaining a positive working infrared-sensitive presensitized plate B.

| (Light-Sensitive Solution b) | |
| --- | --- |
| Specified Copolymer 1 (Tracing Substance) | 0.75 g |
| m, p-Cresol Novolak Resin (m/p ratio = 6/4, weight average molecular weight: 3500, containing 0.5% by weight of unreacted cresol) | 0.25 g |
| p-Toluenesulfonic Acid (Tracing Substance) | 0.003 g |
| Tetrahydrophthalic Anhydride | 0.03 g |
| Cyanine Dye A (Tracing Substance) (having the following structure) | 0.017 g |
| Dye Megafac F-177 in which Counter Anion of Victoria Pure Blue BOH was Changed to 1-Naphthalenesulfonic Acid Anion (Tracing Substance, Fluorine Surfactant Manufactured by Dainippon Ink & Chemicals, Inc.) | 0.05 g |
| γ-Butyllactone | 10 g |
| Methyl Ethyl Ketone | 10 g |
| 1-Methoxy-2-propanol | 1 g |

-continued (Light-Sensitive Solution b)

Cyanine Dye A

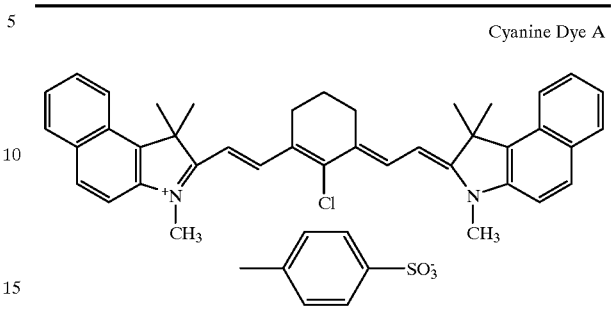

The specified copolymer 1 contained in the light-sensitive solution b was obtained according to the following procedure 1:
(Procedure 1)

In a 500-ml three neck flask equipped with a stirrer, a condenser tube and a dropping funnel, 31.0 g (0.36 mol) of methacrylic acid, 39.1 g (0.36 mol) of ethyl chloroformate and 200 ml of acetonitrile were placed, and the resulting mixture was stirred with cooling on an ice water bath. Then, 36.4 g (0.36 mol) of triethylamine was added dropwise to the mixture through the dropping funnel for about 1 hour. After the dropping, the ice water bath was removed, and the mixture was stirred at room temperature for 30 minutes. To the resulting reaction mixture, 51.7 g (0.30 mol) of p-aminobenzenesulfoamide was added, and the mixture was stirred for 1 hour with warming it to 70° C. on an oil bath. After the reaction was terminated, the mixture was poured into 1 liter of water with stirring the water, and the resulting mixture was stirred for 30 minutes. The mixture was filtered to take out a precipitate, which was slurried with 500 ml of water, followed by filtration of the slurry. The resulting solid was dried to obtain a white solid of N-(p-aminosulfonylphenyl)methacrylamide (yield: 46.6 g). Then, 4.61 g(0.0192 mol) of N-(p-aminosulfonylphenyl) methacrylamide, 2.94 g (0.0258 mol) of ethyl methacrylate, 0.80 g (0.015 mol) of acrylonitrile and 20 g of N,N-dimethylacetamide were placed in a 20-ml three neck flask equipped with a stirrer, a condenser tube and a dropping funnel, and the mixture was stirred with heating to 65° C. on a hot water bath. Then, 0.15 g of "V-65" (manufactured by Wako Pure Chemical Industries, Ltd.) was added thereto, and the resulting mixture was stirred in a stream of nitrogen while keeping the temperature at 65° C. for 2 hours. Further, a mixture of 4.61 g of N-(p-aminosulfonylphenyl) methacrylamide, 2.94 g of ethylmethacrylate, 0.80 g of acrylonitrile, N,N-dimethylacetamide and 0.15 g of "V-65" was added dropwise to the reaction mixture through the dropping funnel. After the dropping was terminated, the resulting mixture was further stirred at 65° C. for 2 hours. After the reaction was terminated, 40 g of methanol was added thereto, followed by cooling. The resulting mixture was poured into 2 liter of water with stirring the water, and the mixture was stirred for 30 minutes. Then, the weight average molecular weight (polystyrene standard) of this specified copolymer 1 was measured by gel permeation chromatography. As a result, it showed 53,000.

The presensitized plate B thus obtained was exposed at a scanning speed of 5 m/s using a semiconductor laser having an output of 500 mW, a wavelength of 830 nm and a beam diameter of 17 μm (1/e²).

The presensitized plate B was processed in the same manner as with Example I-1 with the exception that the following stock developing solution b1 and stock development replenisher b2 were used. The amount of sulfur elements contained as the tracing substance in the specified copolymer 1, p-toluene-sulfonic acid and the dye that are constituent substances of the light-sensitive layer was measured with an atomic emission spectrometer, and the replenishment rate was corrected to conduct processing. As a result of evaluation, very stable processing could be conducted similarly to Example I-1.

| (Stock Developing Solution b1) | |
| --- | --- |
| D-Sorbitol | 2.5% by weight |
| Potassium Hydroxide | 1.3% by weight |
| Diethylenetriaminepenta (methylenephosphonic acid) 5 Na Salts | 0.1% by weight |
| Water | 96.1% by weight |

| (Stock Development Replenisher b2) | |
| --- | --- |
| D-Sorbitol | 5.6% by weight |
| Potassium Hydroxide | 2.5% by weight |
| Diethylenetriaminepenta (methylenephosphonic acid) 5 Na Salts | 0.2% by weight |
| Water | 91.7% by weight |

As described above, the present invention relates to the monitoring method in which when a large number of lithographic printing plates are processed by use of the automatic developing processor, the tracing substance stable under alkaline conditions is added to the light-sensitive layers of the lithographic printing plates, and the amount of the tracing substance dissolved in the developing solution is measured, thereby judging processing ability of the developing solution. Accordingly, when a large number of lithographic printing plates exposed are processed by use of the automatic developing processor, a reduction in the development activity of the developing solution can be accurately judged. The replenishment of the replenisher is carried out according to this judgment, thereby being able to usually keep the development activity of the developing solution good and stable, in spite of changes in the kind of plate, the difference between the case where one side is printed and the case where both sides are printed, and changes in area ratio of an image area to a non-image area.

EXAMPLE II-1

A surface of a 0.24-mm thick aluminum plate was grained with a nylon brush and an aqueous suspension of 400-mesh purmice stone, followed by sufficient washing with water. Then, the plate was immersed in 10% sodium hydroxide at 70° C. for 20 seconds to conduct etching, and further washed with running water, followed by neutralization and washing with 20% $HNO_3$. Subsequently, the plate was washed with water. This was electrolytically surface roughened using alternating waveform current of a sine wave under the conditions of VA =12.7 V in a 0.7% aqueous solution of nitric acid at an electrical quantity of 400 coulombs/$dm^2$. This substrate was subjected to anodic oxidation in a 10% aqueous solution of sodium hydroxide so as to give an aluminum solubility of 0.9 g/$m^2$ at its surface.

Then, the substrate was immersed in a 2% aqueous solution of J3 sodium silicate at 30° C. for 15 seconds to conduct hydrophilization treatment. The support thus prepared was coated with an undercoat solution a having the following composition so as to give a dry weight of 10 mg/$m^2$, followed by drying at 90° C. for 1 minute to provide an undercoat layer.

| (Undercoat Solution a) | |
| --- | --- |
| Phenylphosphonic Acid | 0.06 part by weight |
| Sulfuric Acid | 0.12 part by weight |
| Methanol | 100 parts by weight |

Subsequently, a light-sensitive solution a having the following composition was prepared, and a light-sensitive layer a was formed on the substrate so as to give a dry weight of 1.8 g/$m^2$.

| (Light-Sensitive Layer a) | |
| --- | --- |
| m-Cresol-Formaldehyde Resin (the content of tri- or more nuclear ingredients: 86.5%, molecular weight: 4800) | 1.9 parts by weight |
| Esterified Product of 1,2-Diazonaphthoquinone-5-sulfonyl Chloride and Pyrogallol-Acetone Resin (molecular weight: 2500) | 0.76 parts by weight |
| Tetrahydrophthalic Anhydride | 0.2 part by weight |
| 4-[p-N-(p-Hydroxybenzoyl) aminophenyl]-2,6-bis(trichloromethyl)-s-triazine | 0.02 part by weight |
| Victoria Pure Blue BOH (Manufactured by Hodogaya Chemical Co., Ltd.) | 0.03 part by weight |
| Megafack F-177 (Fluorine Surfactant Manufactured by Dainippon Ink & Chemicals, Inc.) | 0.006 part by weight |
| Methyl Ethyl Ketone | 15 parts by weight |
| Propylene Glycol Monomethyl Ether | 15 parts by weight |

A resin solution for forming a matte layer was sprayed on a surface of the light-sensitive layer in the following manner to provide the matte layer, thereby obtaining a presensitized plate A. As the resin solution for forming the matte layer, a 12% aqueous solution of a partial sodium salt of a methyl methacrylate/ethyl acrylate/acrylic acid (charge weight ratio: 65:20:15) copolymer was prepared. The solution was sprayed with a rotary atomizing electrostatic apparatus. The rotation of an atomizing head was 25,000 rpm, the feed rate of the resin solution was 40 ml/minute, the applied voltage to the atomizing head was −90 kV, the ambient temperature in coating was 25° C., and the relative humidity was 50%. 2.5 seconds after coating, vapor was sprayed on the light-sensitive layer to humidify it. Then, 3 seconds after humidification, hot air having a temperature of 60° C. and a humidity of 10% was sprayed on the light-sensitive layer for 5 seconds to dry it. Mattes had a height of about 6 μm, a size of about 30 μm and a number of 150 mattes/$mm^2$.

The presensitized plate A thus obtained was cut to a size of 1003 mm×800 mm to prepare many plates, which were exposed through an original film for 60 seconds using a 3-kW metal halide lamp from a distance of 1 m. Then, an immersion type developing tank of an automatic developing processor was charged with 18 liters of a developing solution having a pH of about 13.0 which was obtained by diluting the following stock developing solution a1 9 times with tap water, followed by heating at 30° C. Tap water was automatically supplied to a washing tank as the second bath, thereby being able to wash the presensitized plates. A finishing solution tank as the third bath, was charged with 4 liters of a finishing solution obtained by diluting FP-2W (manufactured by Fuji Photo Film Co., Ltd.) twice with tap water. Separately, a tank for a stock development replenisher was charged with 5 liters of the following stock development replenisher a2.

In the automatic developing processor, the developing tank was replenished with a development replenisher obtained by diluting the stock development replenisher a2 6.5 times with water in an amount of 35 ml per square meter of a plate processed, in an amount of 130 ml per hour of operation of the automatic developing processor, and in an amount of 20 ml per hour of stoppage. A reduction in the activity of the developing solution caused by processing of the presensitized plates and carbon dioxide gas in the air was detected with an alternating current impedance meter built in the automatic developing processor, and the developing tank was replenished with water by feedback control of a computer based on the measured value. This kept the activity of the developing solution stored in the developing tank approximately constant. The automatic developing processor was equipped with a device for sampling the developing solution in the developing tank and an atomic emission spectrometer as the device for detecting the amount of the tracing substance so that the measurement of the tracing substance is possible, and a program was improved so that the replenishment rate can be corrected. Also in an after-treatment unit, washing water and the finishing solution FP-2W (the solution diluted twice with tap water) were replenished in amounts of 30 ml and 20 ml, respectively, per square meter of a presensitized plate processed.

| (Stock Developing Solution a1) | |
|---|---|
| [$SiO_2$]/[$K_2O$] Molar Ratio: 1.2 $SiO_2$, Aqueous Solution Containing 12.2% by weight of Potassium Silicate | 99.8% by weigth |
| Polyoxyethylene (the number of moles added n = 12) Sorbitol Ether | 0.2% by weight |
| Zirconium Oxychloride (Tracing Substance) | 0.02% by weight |

| (Stock Development Replenisher a2) | |
|---|---|
| [$SiO_2$]/[$K_2O$] Molar Ratio: 1.0 $SiO_2$, Aqueous Solution Containing 19.9% by weight of Potassium Silicate | 99.6% by weight |
| Polyoxyethylene (the number of moles Added n = 12) Sorbitol Ether | 0.4% by weight |
| Lithium Hydroxide (Tracing Substance) | 0.02% by weight |

The above-mentioned exposed presensitized plates were processed under such conditions at a rate of 50 plates per day, every day excepting Saturday, Sunday and national holidays for 2 months. Then, the concentrations of zirconium and lithium that are the tracing substances were measured with the atomic emission spectrometer, the substitution rate and the concentration rate were calculated, and the replenishment control value was corrected to conduct processing.

The activity was checked by developing the presensitized plate printed with the amount of light stepwise changed using a step tablet (having a difference in optical density per one step of 0.15 and 25 steps), reading the step number of an image left corresponding to the amount of light on the plate, and comparing it with the step number at the beginning of processing. During the test period of 2 months, a clear portion (the image was completely removed) was kept at 5.5 steps, and a solid portion (the image completely remained) was kept at 11.5 steps, thus maintaining stable processing.

COMPARATIVE EXAMPLE II-1

The presensitized plate A was processed and evaluated in the same manner as with Example II-1 with the exception that the following stock developing solution b1 and stock development replenisher b2 in which the tracing substances were removed from the stock developing solution a1 and stock development replenisher a2 of Example II-1, respectively, were used and the amount of the tracing substances was not measured. In this case, the step number of the step tablet begun to gradually increase about 1 week after the start of the test, although the replenishment was conducted as established. Then, the developing solution was sampled, and the concentration of the main ingredient was analyzed in detail. As a result, it turned out that the developing solution was concentrated by the evaporation of water.

| (Stock Developing Solution b1) | |
|---|---|
| [$SiO_2$]/[$K_2O$] Molar Ratio: 1.2 $SiO_2$, Aqueous Solution Containing 12.2% by weight of Potassium Silicate | 99.8% by weight |
| Polyoxyethylene (the number of moles added n = 12) Sorbitol Ether | 0.2% by weight |

| (Stock Development Replenisher b2) | |
|---|---|
| [$SiO_2$]/[$K_2O$] Molar Ratio: 1.0 $SiO_2$, Aqueous Solution Containing 19.9% by weight of Potassium Silicate | 99.6% by weight |
| Polyoxyethylene (the number of moles added n = 12) Sorbitol Ether | 0.4% by weight |

EXAMPLE II-2

The presensitized plate A was processed and evaluated in the same manner as with Example II-1 with the exception that the following stock developing solution c1 and stock development replenisher c2 were used and the concentrations of potassium and lithium that are the tracing substances were measured. As a result, very stable processing could be conducted similarly to Example II-1.

| (Stock Developing Solution c1) | |
|---|---|
| D-Sorbitol | 21.2% by weight |
| Potassium Hydroxide | 7.5% by weight |
| Adduct of 30 Mol Ethylene Oxide with Triethanolamine | 0.16% by weight |
| DEQUEST 2066 (Chelate Solution Manufactured by Monsanto Co., U.S.A.) | 0.34% by weight |
| Water | 70.75% by weight |
| Potassium Silicate (Tracing Substance) | 0.05% by weight |

| (Stock Development Replenisher c2) | |
| --- | --- |
| D-Sorbitol | 26.5% by weight |
| Potassium Hydroxide | 10.7% by weight |
| Adduct of 30 Mol Ethylene Oxide with Triethanolamine | 0.24% by weight |
| DEQUEST 2066 (Chelate Solution Manufactured by Monsanto Co., U.S.A.) | 1.2% by weight |
| Water | 61.34% by weight |
| Lithium Hydroxide (Tracing Substance) | 0.02% by weight |

EXAMPLE II-3

A surface of a 0.30-mm thick aluminum plate was washed and degreased, and then, grained with a rotary nylon brush and an aqueous suspension of 400-mesh pumice stone, followed by sufficient washing with water. Then, the plate was immersed in 25% sodium hydroxide at 45° C. for 9 seconds to conduct etching, and then, washed with running water, followed by neutralization and washing with 20% $HNO_3$. Subsequently, the plate was washed with water. This was provided with 3 g/m² of a direct current anodic oxide film at 15 A/dm² using 7% sulfuric acid as an electrolyte, followed by washing with water and drying. The plate was further treated with an aqueous solution containing 2.5% sodium silicate by weight at 30° C. for 10 seconds, and coated with the following undercoat solution b. The resulting coating film was dried at 80° C. for 15 seconds to obtain a substrate. The amount of the coating film after drying was 15 mg/m².

| (Undercoat Solution b) | |
| --- | --- |
| The Following Compound 1 | 0.3 part by weight |
| Water | 1 part by weight |
| Methanol | 100 parts by weight |

Compound 1

—(CH₂—CH)₈₅—  —(CH₂—CH)₁₅—
        |                |
       (phenyl)        (phenyl)
        |                |
       COOH          CH₂N⁺Et₃ Cl⁻

Molecular weight: 28,000

Subsequently, a light-sensitive solution b having the following composition was prepared, and a light-sensitive layer was formed on the above-mentioned substrate so as to give a dry weight of 1.1 g/m², thereby obtaining a positive working infrared-sensitive presensitized plate B.

| (Light-Sensitive Solution b) | |
| --- | --- |
| Specified Copolymer 1 (Tracing Substance) | 0.75 g |
| m, p-Cresol Novolak Resin (m/p ratio = 6/4, weight average molecular weight: 3500, containing 0.5% by weight of unreacted cresol) | 0.25 g |
| Tetrahydrophthalic Anhydride | 0.03 g |
| Cyanine Dye A (having the following Structure) | 0.017 g |
| Dye Megafac F-177 in which Counter | 0.05 g |

-continued

| (Light-Sensitive Solution b) | |
| --- | --- |
| Anion of Victoria Pure Blue BOH was Changed to 1-Naphthalenesulfonic Acid Anion (Fluorine Surfactant Manufactured by Dainippon Ink & Chemicals, Inc.) | |
| γ-Butyllactone | 10 g |
| Methyl Ethyl Ketone | 10 g |
| 1-Methoxy-2-propanol | 1 g |

Cyanine Dye A

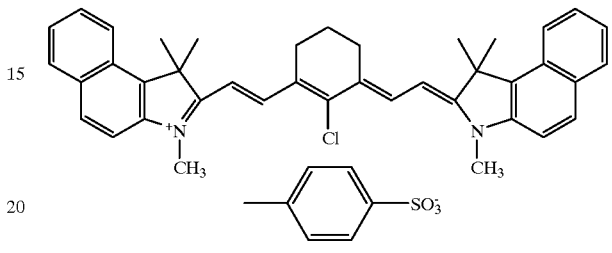

The specified copolymer 1 contained in the light-sensitive solution b was obtained according to the following procedure 1:

(Procedure 1)

In a 500-ml three neck flask equipped with a stirrer, a condenser tube and a dropping funnel, 31.0 g (0.36 mol) of methacrylic acid, 39.1 g (0.36 mol) of ethyl chloroformate and 200 ml of acetonitrile were placed, and the resulting mixture was stirred with cooling on an ice water bath. Then, 36.4 g (0.36 mol) of triethylamine was added dropwise to the mixture through the dropping funnel for about 1 hour. After the dropping, the ice water bath was removed, and the mixture was stirred at room temperature for 30 minutes. To the resulting reaction mixture, 51.7 g (0.30 mol) of p-aminobenzenesulfoamide was added, and the mixture was stirred for 1 hour with warming it to 70° C. on an oil bath. After the reaction was terminated, the mixture was poured into 1 liter of water with stirring the water, and the resulting mixture was stirred for 30 minutes. The mixture was filtered to take out a precipitate, which was slurried with 500 ml of water, followed by filtration of the slurry. The resulting solid was dried to obtain a white solid of N-(p-aminosulfonylphenyl)methacrylamide (yield: 46.6 g). Then, 4.61 g(0.0192 mol) of N-(p-aminosulfonylphenyl)methacrylamide, 2.94 g (0.0258 mol) of ethyl methacrylate, 0.80 g (0.015 mol) of acrylonitrile and 20 g of N,N-dimethylacetamide were placed in a 20-ml three neck flask equipped with a stirrer, a condenser tube and a dropping funnel, and the mixture was stirred with heating to 65° C. on a hot water bath. Then, 0.15 g of "V-65" (manufactured by Wako Pure Chemical Industries, Ltd.) was added thereto, and the resulting mixture was stirred in a stream of nitrogen while keeping the temperature at 65° C. for 2 hours. Further, a mixture of 4.61 g of N-(p-aminosulfonylphenyl)methacrylamide, 2.94 g of ethyl methacrylate, 0.80 g of acrylonitrile, N,N-dimethylacetamide and 0.15 g of "V-65" was added dropwise to the reaction mixture through the dropping funnel. After the dropping was terminated, the resulting mixture was further stirred at 65° C. for 2 hours. After the reaction was terminated, 40 g of methanol was added thereto, followed by cooling. The resulting mixture was poured into 2 liter of water with stirring the water, and the mixture was stirred for 30 minutes. Then, the weight average molecular weight (polystyrene standard) of this specified copolymer 1 was measured by gel permeation chromatography. As a result, it showed 53,000.

The presensitized plate B thus obtained was exposed at a scanning speed of 5 m/s using a semiconductor laser having an output of 500 mW, a wavelength of 830 nm and a beam diameter of 17 μm (1/e$^2$).

The presensitized plate B was processed in the same manner as with Example II-1 with the exception that the following stock developing solution d1 and stock development replenisher d2 were used. As a result of evaluation, very stable processing could be conducted similarly to Example II-1.

| (Stock Developing Solution d1) | |
|---|---|
| D-Sorbitol | 2.5% by weight |
| Potassium Hydroxide | 1.3% by weight |
| Diethylenetriaminepenta (methylenephosphonic acid) 5 Na Salts | 0.1% by weight |
| Water | 96.1% by weight |
| Zirconium Oxychloride (Tracing Substance) | 0.02% by weight |

| (Stock Development Replenisher d2) | |
|---|---|
| D-Sorbitol | 5.6% by weight |
| Potassium Hydroxide | 2.5% by weight |
| Diethylenetriaminepenta (methylenephosphonic acid) 5 Na Salts | 0.2% by weight |
| Water | 91.7% by weight |
| Lithium Hydroxide (Tracing Substance) | 0.02% by weight |

EXAMPLE II-4

The presensitized plate A was processed and evaluated in the same manner as with Example II-1 with the exception that the following stock developing solution e1 and stock development replenisher e2 were used and the concentrations of lithium that is the tracing substance and sodium that is the main ingredient were measured. As a result, very stable processing could be conducted similarly to Example II-1.

| (Stock Developing Solution e1) | |
|---|---|
| D-Sorbitol | 21.2% by weight |
| Potassium Hydroxide | 7.5% by weight |
| Adduct of 30 Mol Ethylene Oxide with Triethanolamine | 0.16% by weight |
| DEQUEST 2066 (Chelate Solution Manufactured by Monsanto Co., U.S.A.) | 0.34% by weight |
| Water | 70.75% by weight |

| (Stock Development Replenisher e2) | |
|---|---|
| D-Sorbitol | 26.5% by weight |
| Potassium Hydroxide | 10.7% by weight |
| Adduct of 30 Mol Ethylene Oxide with Triethanolamine | 0.24% by weight |
| DEQUEST 2066 (Chelate Solution Manufactured by Monsanto Co., U.S.A.) | 1.2% by weight |
| Water | 61.34% by weight |
| Lithium Hydroxide (Tracing Substance) | 0.02% by weight |

EXAMPLE II-5

The presensitized plate A was processed and evaluated in the same manner as with Example II-1 with the exception that the following stock developing solution f1 and stock development replenisher f2 were used and the concentrations of potassium and sodium that are the main ingredients were measured. As a result, very stable processing could be conducted similarly to Example II-1.

| (Stock Developing Solution f1) | |
|---|---|
| D-Sorbitol | 21.2% by weight |
| Potassium Hydroxide | 7.5% by weight |
| Adduct of 30 Mol Ethylene Oxide with Triethanolamine | 0.16% by weight |
| DEQUEST 2066 (Chelate Solution Manufactured by Monsanto Co., U.S.A.) | 0.34% by weight |
| Water | 70.75% by weight |

| (Stock Development Replenisher f2) | |
|---|---|
| D-Sorbitol | 26.5% by weight |
| Potassium Hydroxide | 10.7% by weight |
| Adduct of 30 Mol Ethylene Oxide with Triethanolamine | 0.24% by weight |
| DEQUEST 2066 (Chelate Solution Manufactured by Monsanto Co., U.S.A.) | 1.2% by weight |
| Water | 61.34% by weight |

Claim 3 of the present invention is directed to a monitoring method of a developing solution for lithographic printing plates, wherein when the lithographic printing plates are processed by use of an automatic developing processor while replenishing the developing solution which has been provided at the beginning of development with a development replenisher, a tracing substance stable under alkaline conditions and not contributing to development is added to one or both of the developing solution which has been provided at the beginning of development and the development replenisher, in different concentrations when added to both, and the amount of the tracing substance in the solution during development is measured, thereby determining the substitution rate of the development replenisher for the developing solution which has been provided at the beginning of development. Accordingly, the state of the developing solution can be accurately confirmed, and when a large number of lithographic printing plates are processed by use of the automatic developing processor utilizing this, the activity of the developing solution can always be kept in the state of the fresh solution.

Claim 4 of the present invention is directed to a monitoring method of a developing solution for lithographic printing plates, wherein when the lithographic printing plates are processed by use of an automatic developing processor while replenishing the developing solution which has been provided at the beginning of development with a development replenisher, a tracing substance stable under alkaline conditions and not contributing to development is added to one or both of the developing solution which has been provided at the beginning of development and the development replenisher, in different concentrations when added to both, the amount of the tracing substance in the solution during development is measured, thereby determining the substitution rate of the development replenisher for the developing solution which has been provided at the beginning of development, and the substitution rate is further compared with the substitution rate determined from the integrated discharge amount of a pump of the automatic developing processor, thereby determining the concentration rate of the developing solution. Accordingly, the state of the developing solution can be accurately confirmed, and when a large number of lithographic printing plates are processed by use of the automatic developing processor utilizing this, the activity of the developing solution can always be kept in the state of the fresh solution.

Claim 5 of the present invention is directed to a monitoring method of a developing solution for lithographic printing plates, wherein when the lithographic printing plates are processed by use of an automatic developing processor while replenishing the developing solution which has been provided at the beginning of development with a development replenisher, different tracing substances stable under alkaline conditions and not contributing to development are each added to the developing solution which has been provided at the beginning of development and the development replenisher, respectively, the amounts of the tracing substances in the solution during development are measured, thereby determining the substitution rate of the development replenisher for the developing solution which has been provided at the beginning of development and the concentration rate of the developing solution. Accordingly, the state of the developing solution can be accurately confirmed, and when a large number of lithographic printing plates are processed by use of the automatic developing processor utilizing this, the activity of the developing solution can always be kept in the state of the fresh solution.

Claim 6 of the present invention is directed to a monitoring method of a developing solution for lithographic printing plates, wherein when the lithographic printing plates are processed by use of an automatic developing processor while replenishing the developing solution which has been provided at the beginning of development with a development replenisher, a tracing substance stable under alkaline conditions and not contributing to development is added to either of the developing solution which has been provided at the beginning of development or the development replenisher, the amount of the tracing substance in the solution during development and the concentration of a main ingredient of the developing solution are measured, thereby determining the substitution rate of the development replenisher for the developing solution which has been provided at the beginning of development and the concentration rate of the developing solution. Accordingly, the state of the developing solution can be accurately confirmed, and when a large number of lithographic printing plates are processed by use of the automatic developing processor utilizing this, the activity of the developing solution can always be kept in the state of the fresh solution.

Claim 7 of the present invention is directed to a monitoring method of a developing solution for lithographic printing plates, wherein when the lithographic printing plates are processed by use of an automatic developing processor while replenishing the developing solution which has been provided at the beginning of development with a development replenisher, a main development ingredient of the developing solution which has been provided at the beginning of development is different from a main development ingredient of the development replenisher, and the concentrations of both the main development ingredients are measured, thereby determining the substitution rate of the development replenisher for the developing solution which has been provided at the beginning of development and the concentration rate of the developing solution. Accordingly, the state of the developing solution can be accurately confirmed, and when a large number of lithographic printing plates are processed by use of the automatic developing processor utilizing this, the activity of the developing solution can always be kept in the state of the fresh solution.

While the present invention has been described in detail and with reference to specific embodiments thereof, it will be apparent to one skilled in the art that various changes and modifications can be made therein without departing from the sprit and scope thereof.

What is claimed is:

1. A monitoring method of a developing solution for lithographic printing plates, which comprises, when a large number of lithographic printing plates are processed by use of an automatic developing processor, adding a tracing substance stable under alkaline conditions to light-sensitive layers of the lithographic printing plates, or one or both of the developing solution which has been provided at the beginning of development and a development replenisher, and then measuring the amount of said tracing substance in the developing solution during development, thereby judging processing ability of the developing solution.

2. The monitoring method as in claim 1, wherein when a large number of lithographic printing plates are processed by use of the automatic developing processor, the tracing substance stable under alkaline conditions is added to the light-sensitive layers of said lithographic printing plates, and the amount of said tracing substance dissolved in the developing solution is measured, thereby judging processing ability of said developing solution.

3. The monitoring method as in claim 1, wherein when the lithographic printing plates are processed by use of the automatic developing processor while replenishing the developing solution which has been provided at the beginning of development with the development replenisher, the tracing substance stable under alkaline conditions and not contributing to development is added to one or both of the developing solution which has been provided at the beginning of development and the development replenisher, in different concentrations when added to both, and then the amount of said tracing substance in the solution during development is measured, thereby determining the substitution rate of the development replenisher for the developing solution which has been provided at the beginning of development.

4. The monitoring method as in claim 1, wherein when the lithographic printing plates are processed by use of the automatic developing processor while replenishing the developing solution which has been provided at the beginning of development with the development replenisher, the tracing substance stable under alkaline conditions and not contributing to development is added to one or both of the developing solution which has been provided at the beginning of development and the development replenisher, in different concentrations when added to both, the amount of said tracing substance in the solution during development is measured, thereby determining the substitution rate of the development replenisher for the developing solution which has been provided at the beginning of development, and said rate of substitution is further compared with the substitution rate determined from the integrated discharge amount of a pump of the automatic developing processor, thereby determining the concentration rate of the developing solution.

5. The monitoring method as in claim 1, wherein when the lithographic printing plates are processed by use of the automatic developing processor while replenishing the developing solution which has been provided at the beginning of development with the development replenisher, the different tracing substances stable under alkaline conditions and not contributing to development are each added to the developing solution which has been provided at the beginning of development and the development replenisher, respectively, the amounts of said tracing substances in the solution during development are measured, thereby determining the substitution rate of the development replenisher for the developing solution which has been provided at the beginning of development and the concentration rate of the developing solution.

6. The monitoring method as in claim 1, wherein when the lithographic printing plates are processed by use of the automatic developing processor while replenishing the developing solution which has been provided at the beginning of development with the development replenisher, the tracing substance stable under alkaline conditions and not contributing to development is added to either of the developing solution which has been provided at the beginning of development or the development replenisher, the amount of said tracing substance in the solution during development and the concentration of a main ingredient of the developing solution are measured, thereby determining the substitution rate of the development replenisher for the developing solution which has been provided at the beginning of development and the concentration rate of the developing solution.

7. The monitoring method as in claim 1, wherein when the lithographic printing plates are processed by use of the automatic developing processor while replenishing the developing solution which has been provided at the beginning of development with the development replenisher, a main development ingredient of the developing solution which has been provided at the beginning of development is different from a main development ingredient of the development replenisher, and the concentrations of both the main development ingredients are measured, thereby determining the substitution rate of the development replenisher for the developing solution which has been provided at the beginning of development and the concentration rate of the developing solution.

* * * * *